United States Patent
Kim et al.

(10) Patent No.: US 12,230,343 B2
(45) Date of Patent: Feb. 18, 2025

(54) METHOD OF DETECTING A NOT-OPEN STRING (N/O STRING), CONVERTING TARGET DATA, WITH A VALUE THAT MATCHES INHIBIT DATA, TO BE PROGRAMMED TO TARGET MEMORY CELLS IN THE N/O STRING, AND PROGRAMMING THE MEMORY CELLS

(71) Applicant: SAMSUNG ELECTRONICS CO., LTD., Suwon-si (KR)

(72) Inventors: Bohchang Kim, Suwon-si (KR); Wontaeck Jung, Hwaseong-si (KR); Kuihan Ko, Seoul (KR); Jaeyong Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 143 days.

(21) Appl. No.: 17/324,787

(22) Filed: May 19, 2021

(65) Prior Publication Data

US 2022/0028466 A1    Jan. 27, 2022

(30) Foreign Application Priority Data

Jul. 24, 2020    (KR) .................. 10-2020-0092557

(51) Int. Cl.
*G11C 29/04*    (2006.01)
*G11C 16/14*    (2006.01)
(Continued)

(52) U.S. Cl.
CPC .............. *G11C 29/04* (2013.01); *G11C 16/14* (2013.01); *G11C 16/26* (2013.01); *G11C 16/3404* (2013.01)

(58) Field of Classification Search
CPC ......... G11C 29/04; G11C 16/14; G11C 16/26; G11C 16/3404; G11C 16/102;
(Continued)

(56) References Cited

U.S. PATENT DOCUMENTS 7,639,539 B2    12/2009    Cho et al.
7,679,133 B2    3/2010    Son et al.
(Continued)

FOREIGN PATENT DOCUMENTS

| KR | 10-2008-0107921 A | 12/2008 |
| KR | 10-2016-0107606 A | 9/2016 |
| KR | 10-1736457 | 5/2017 |

OTHER PUBLICATIONS

Office Action issued in Corresponding KR Patent Application No. 10-2020-0092557 on Sep. 9, 2024.

*Primary Examiner* — Anthan Tran
(74) *Attorney, Agent, or Firm* — F. CHAU & ASSOCIATES, LLC

(57) ABSTRACT

A memory device including: a memory cell array including a plurality of memory cells forming a plurality of strings in a vertical direction with a substrate; and a control logic configured to detect a not-open string (N/O string) from the plurality of strings in response to a write command and convert pieces of target data to be programmed on a plurality of target memory cells in the N/O string so that the pieces of target data have a value that limits a number of times a program voltage is applied to the plurality of target memory cells.

15 Claims, 27 Drawing Sheets

(51) Int. Cl.
*G11C 16/26* (2006.01)
*G11C 16/34* (2006.01)

(58) Field of Classification Search
CPC . G11C 16/3468; G11C 29/52; G11C 11/5628;
G11C 11/5642; G11C 2211/5642; G11C
16/08; G11C 16/10; G11C 16/16; G11C
16/3445; G11C 16/3459; G11C 16/349;
G11C 16/3495; G11C 16/048
See application file for complete search history.

(56) References Cited

U.S. PATENT DOCUMENTS

| | | | |
|---|---|---|---|
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,880,964 B2 | 11/2014 | Wan et al. | |
| 9,053,978 B2 | 6/2015 | Nam | |
| 9,214,235 B2 * | 12/2015 | Rhie | H10B 43/27 |
| 9,318,224 B2 | 4/2016 | Kwak | |
| 9,672,931 B2 | 6/2017 | Yoon et al. | |
| 9,704,596 B1 * | 7/2017 | Shim | G11C 16/0483 |
| 9,891,848 B2 | 2/2018 | Asami et al. | |
| 10,026,482 B2 | 7/2018 | Yamauchi | |
| 2011/0204420 A1 | 8/2011 | Kim et al. | |
| 2011/0233648 A1 | 9/2011 | Seol et al. | |
| 2012/0051138 A1 | 3/2012 | Kim et al. | |
| 2015/0049549 A1 | 2/2015 | Asaoka | |
| 2017/0293514 A1 * | 10/2017 | Cadigan | G06F 11/0727 |
| 2019/0115081 A1 | 4/2019 | Lee | |
| 2019/0172512 A1 * | 6/2019 | Oh | G11C 29/1201 |

\* cited by examiner

FIG. 2

| N/O STRING DETECTION | TARGET DATA CONVERSION | PROGRAM |

| | DT_STEP |
|---|---|
| BL | VBL1(VCC) |
| Selected SSL | VSSL1(On) |
| Unselected SSL | VSSL2(Off) |
| WL | VCK1 |
| GSL | VGSL1(On) |
| CSL | VCSL1(VSS) |
| Substrate | VSUB(VSS) |

|  | E | | P | |
|---|---|---|---|---|
|  | Normal | N/O | Normal | N/O |
| Page | 1 | 1 | 0 | 1 |

FIG. 8B

| | E | | P1 | | P2 | | P3 | | |
|---|---|---|---|---|---|---|---|---|---|
| | Normal | N/O | Normal | N/O | Normal | N/O | Normal | N/O | |
| 1st Page | 1 | 1 | 0 | 1 | 0 | 1 | 1 | 1 | |
| 2nd Page | 1 | 1 | 1 | 1 | 0 | 1 | 0 | 1 | TB_2 |

FIG. 8C

| | E | | P1 | | P2 | | P3 | | P4 | | P5 | | P6 | | P7 | |
|---|---|---|---|---|---|---|---|---|---|---|---|---|---|---|---|---|
| | Normal | N/O | Normal | N/O | Normal | N/O | Normal | N/O | Normal | N/O | Normal | N/O | Normal | N/O | Normal | N/O |
| 1st Page | 1 | 1 | 0 | 1 | 0 | 1 | 0 | 1 | 0 | 1 | 1 | 1 | 1 | 1 | 1 | 1 |
| 2nd Page | 1 | 1 | 1 | 1 | 0 | 1 | 0 | 1 | 1 | 1 | 1 | 1 | 0 | 1 | 0 | 1 |
| 3rd Page | 1 | 1 | 1 | 1 | 1 | 1 | 0 | 1 | 0 | 1 | 0 | 1 | 0 | 1 | 1 | 1 |

|  | DT_STEP_1 | DT_STEP_2 |
|---|---|---|
| BL | Float | VBL1(VCC) |
| Selected SSL | Float or VSSL3 | VSSL1(On) |
| Unselected SSL | | VSSL2(Off) |
| WL | Vwe (VSS) | VCK2 |
| GSL | Float or VGSL2 | VGSL1(On) |
| CSL | Float | VCSL1(VSS) |
| Substrate | Vers | VSS |

METHOD OF DETECTING A NOT-OPEN STRING (N/O STRING), CONVERTING TARGET DATA, WITH A VALUE THAT MATCHES INHIBIT DATA, TO BE PROGRAMMED TO TARGET MEMORY CELLS IN THE N/O STRING, AND PROGRAMMING THE MEMORY CELLS

CROSS-REFERENCE TO RELATED APPLICATION

This application claims priority under 35 U.S.C. § 119 to Korean Patent Application No. 10-2020-0092557, filed on Jul. 24, 2020, in the Korean Intellectual Property Office, the disclosure of which is incorporated by reference herein in its entirety.

TECHNICAL FIELD

The inventive concept relates to a memory device and, more particularly, to a memory device including at least one not-open string and a memory system including the same.

DISCUSSION OF RELATED ART

As data technology develops, bulk data needs to be stored with high reliability. Consequently, a three-dimensional memory device having a high degree of integration has been developed. A not-open string (or an off string), which does not have a channel, may exist due to a process error in the formation of a three-dimensional memory device. A not-open string may adversely impact the three-dimensional memory device since memory cells of the not-open string may not be correctly programmed, and the memory cells of the not-open string may negatively affect neighboring memory cells.

SUMMARY

According to an exemplary embodiment of the inventive concept, there is provided a memory device including: a memory cell array including a plurality of memory cells forming a plurality of strings in a vertical direction with a substrate; and a control logic configured to detect a not-open string (N/O string) from the plurality of strings in response to a write command and convert pieces of target data to be programmed on a plurality of target memory cells in the N/O string so that the pieces of target data have a value that limits a number of times a program voltage is applied to the plurality of target memory cells.

According to an exemplary embodiment of the inventive concept, there is provide an operating method of a memory device including a plurality of memory cells forming a plurality of strings in a vertical direction with a substrate, the operating method including: detecting an N/O string from the plurality of strings in response to a write command; converting, to have a value, pieces of target data to be programmed on a plurality of target memory cells in the N/O string; and performing a program operation on the plurality of memory cells.

According to an exemplary embodiment of the inventive concept, there is provided a memory system including: a memory device including a plurality of blocks each block including a plurality of memory cells arranged in a vertical direction with respect to a substrate; and a memory controller configured to control a memory operation of the memory device, wherein the memory device is configured to perform, while programming a target block in response to a write command received from the memory controller, a conversion operation on pieces of target data that are to be programmed on a plurality of target memory cells in at least one N/O string of the target block, such that the pieces of target data have a value that limits a number of times a program voltage is applied to the plurality of target memory cells.

According to an exemplary embodiment of the inventive concept, there is provided a memory device including: a memory cell area including a first metal pad; a peripheral circuit area including a second metal pad and vertically connected to the memory cell area through the first and second metal pads; a memory cell array including a plurality of memory cells forming a plurality of strings in a vertical direction with a substrate in the memory cell area; and a control logic configured to detect, in the peripheral circuit area, an N/O string from the plurality of strings in response to a write command and convert pieces of target data to be programmed on a plurality of target memory cells in the detected N/O string so that the pieces of target data have a value that limits a number of times a program voltage is applied to the plurality of target memory cells.

According to an exemplary embodiment of the inventive concept, there is provided a memory device including: a memory cell array including a plurality of memory cells forming a plurality of strings in a direction perpendicular with a substrate; and a control logic configured to detect an N/O string in a memory block of the memory cell array in response to a program command, convert target data to be programmed on the N/O string into inhibit data and program the converted target data on target memory cells in the N/O string.

BRIEF DESCRIPTION OF THE DRAWINGS

The above and other features of the inventive concept will be more clearly understood by describing in detail exemplary embodiments thereof in conjunction with the accompanying drawings in which:

FIG. 2 is a view for describing an operation of a memory device according to an exemplary embodiment of the inventive concept;

FIGS. 8A, 8B and 8C are tables for describing a conversion operation on pieces of target data corresponding to a not-open string (N/O string) of a memory device, according to an exemplary embodiment of the inventive concept;

FIGS. 10A and 10B are views for describing an operating method of a memory device, on which the embodiment described with reference to FIG. 9 is reflected;

DETAILED DESCRIPTION THE EMBODIMENTS

Hereinafter, exemplary embodiments of the inventive concept will be described in detail with reference to the accompanying drawings. Hereinafter, the embodiments of the inventive concept may be described with reference to NAND flash memory. However, the inventive concept is not limited to NAND flash memory. For example, the inventive concept may be applied to various non-volatile memory devices such as electrically erasable and programmable read only memory (EEPROM), a NOR flash memory device, phase change random access memory (PRAM), magnetic RAM (MRAM), resistive RAM (RRAM), and ferroelectric RAM (FRAM).

Figure 1:
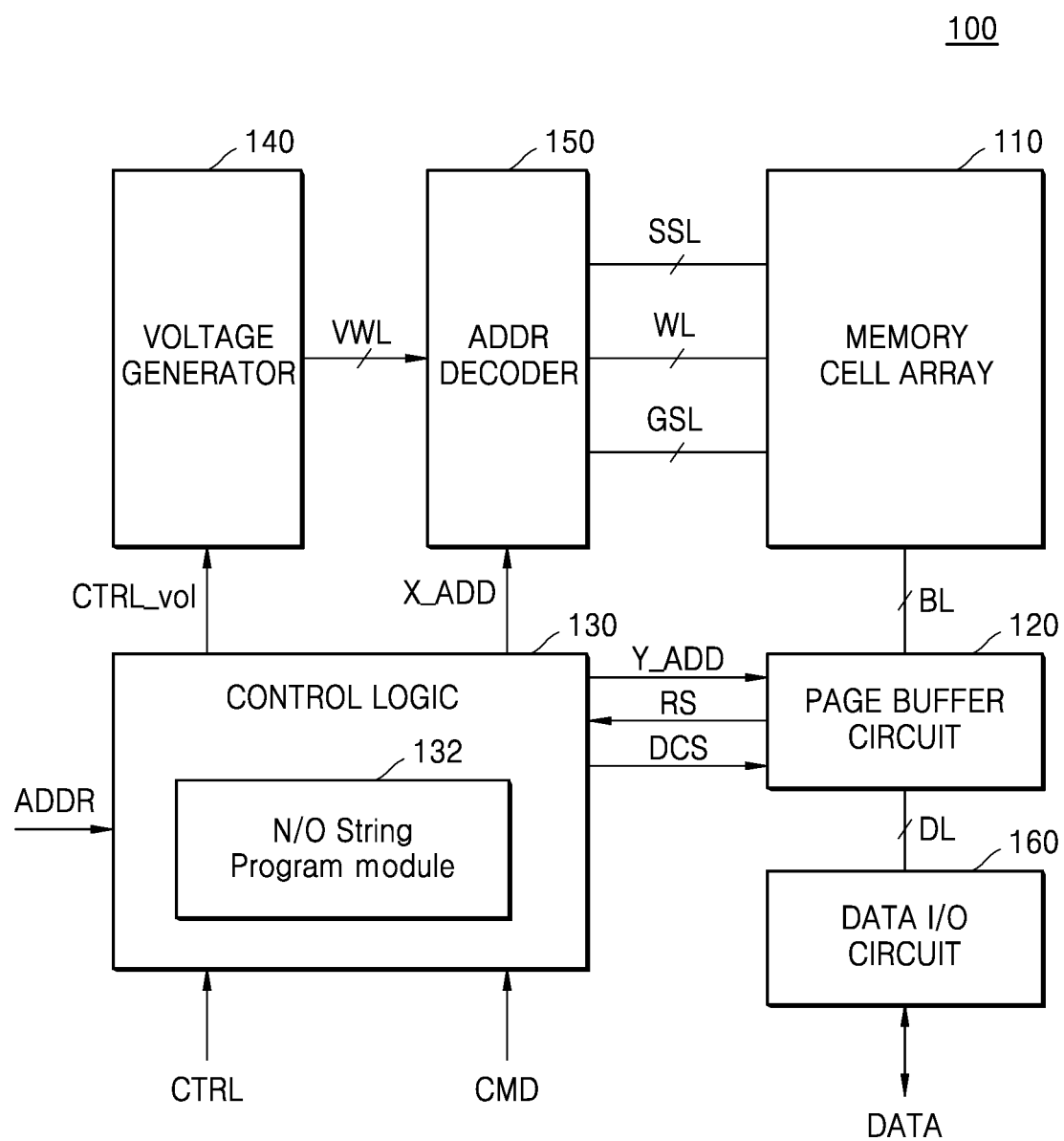
FIG. 1 is a block diagram of a memory device according to an exemplary embodiment of the inventive concept.

FIG. 1 is a block diagram of a memory device 100 according to an exemplary embodiment of the inventive concept, and FIG. 2 is a view for describing an operation of the memory device 100 according to an exemplary embodiment of the inventive concept.

Referring to FIG. 1, the memory device 100 may include a memory cell array 110, a page buffer circuit 120, a control logic 130, a voltage generator 140, an address decoder 150, and a data input/output (I/O) circuit 160. In addition, the control logic 130 may include a not-open string (N/O string) program module 132 to operate according to exemplary embodiments of the inventive concept. The memory device 100 may further include various other kinds of functional blocks associated with a memory operation. The N/O string program module 132 may be implemented by hardware logic or software logic. In addition, the N/O string program module 132 may be included in a memory controller.

The memory cell array 110 may include a plurality of strings (or cell strings) arranged on a substrate in row and column directions. Each string may include a plurality of memory cells stacked in a direction perpendicular to the substrate. In other words, the memory cells may be stacked in the direction perpendicular to the substrate to form a three-dimensional (3D) structure, Each memory cell may be a cell type such as a single-level cell, a multi-level cell, or a triple-level cell. Each memory cell may also be a quad-level cell. The inventive concept may be applied according to various cell types of memory cells.

The memory cell array 110 may correspond to those described in US. Pat. Nos. 7,679,133, 8,553,466, 8,654,587, and 8,559,235 and U.S. Patent Application Number 2011/0233648, the disclosures of which are incorporated by reference herein in their entireties. For example, U.S. Pat. Nos. 7,679,133, 8,553,466, 8,654,587, and 8,559,235 and U.S. Patent Application No. 2011/0233648 disclose features of a 3D memory cell array formed in a plurality of levels and sharing word lines WL and/or bit lines BL between the levels. In addition, U.S. Patent Application Nos. 2012-0051138 and 2011-0204420 are incorporated by reference herein in their entireties.

The memory cells in the memory cell array 110 may be connected to word lines WL, string select lines SSL, ground select lines GSL, and bit lines BL. The memory cell array 110 may be connected to the address decoder 150 through the word lines WL, the string select lines SSL, and the ground select lines GSL and connected to the page buffer circuit 120 through the bit lines BL.

The memory cell array 110 may include an N/O string. A detailed description of the N/O string will be made with reference to FIGS. 3A to 3C.

The page buffer circuit 120 may temporarily store pieces of data to be programmed to the memory cell array 110 and pieces of data read from the memory cell array 110. The page buffer circuit 120 may include a plurality of latch units (or page buffers). For example, each latch unit may include a plurality of latches respectively corresponding to a plurality of bit lines BL and store data in a page unit. According to some embodiments of the inventive concept, the page buffer circuit 120 may include a sensing latch unit, and the sensing latch unit may include a plurality of sensing latches respectively corresponding to the plurality of bit lines BL. In addition, each sensing latch may be connected to a sensing node at which data is sensed, through a corresponding bit line BL.

The control logic 130 controls a general operation of the memory device 100 and, for example, may program data on the memory cell array 110 based on a command CMD, an address ADDR, and a control signal CTRL received from a memory controller, read data from the memory cell array 110, or output various types of internal control signals to erase data stored in the memory cell array 110.

The various types of internal control signals output from the control logic 130 may be provided to the page buffer circuit 120, the voltage generator 140, and the address decoder 150. Particularly, the control logic 130 may provide a voltage control signal CTRL_vol to the voltage generator 140. The voltage generator 140 may include one or more pumps and generate voltages VWL having various levels according to a pumping operation based on the voltage control signal CTRL_vol. VWL may correspond to wordline voltages. In addition, the control logic 130 may provide a row address X_ADD to the address decoder 150 and provide a column address Y_ADD to the page buffer circuit 120. Hereinafter, an operation of the N/O string program module 132 will be described, and the control logic 130 may generate internal control signals matched with an operation of the N/O string program module 132 and output the generated internal control signals to each functional block of the memory device 100.

The N/O string program module 132 according to an exemplary embodiment of the inventive concept may detect an N/O string among a plurality of strings included in the memory cell array 110, in response to the write command CMD received from the memory controller. For example, the N/O string program module 132 may detect an N/O string from a target memory block or a target memory sub-block of the memory cell array 110, the target memory block or target memory sub-block being matched with the address ADDR corresponding to the write command CMD. The N/O string program module 132 may provide internal control signals, e.g., the voltage control signal CTRL_vol, the row address X_ADD, and the column address Y_ADD, to the voltage generator 140, the address decoder 150, and the page buffer circuit 120, respectively. A detailed description thereof will be made with reference to FIGS. 6A to 6F, 10A, and 10B.

For example, the N/O string program module 132 may apply a check voltage to a plurality of word lines WL connected to a plurality of memory cells of the memory cell array 110 by using the voltage generator 140. The check voltage may be higher than a reference voltage. The check voltage may have different levels according to cell types of the plurality of memory cells or have the same level regardless of the cell types of the plurality of memory cells, depending on whether to perform an erase operation m a program operation. The reference voltage may be a voltage for verifying a top-level program state of memory cells or a voltage for verifying an erase state, depending on whether to perform an erase operation on a target memory block or a target memory sub-block in a program operation.

The page buffer circuit 120 may provide result signals RS output from bit lines BL to the N/O string program module 132 when the check voltage is applied to a plurality of word lines WL connected to a plurality of memory cells. For example, the check voltage may be applied to word lines WL and then result signals RS may be provided to the N/O string program module 132. The N/O string program module 132 may detect an N/O string among a plurality of strings based on the result signals RS received from the page buffer circuit 120. For example, the N/O string program module 132 may check a plurality of target memory cells turned off by the check voltage among a plurality of memory cells based on the result signals RS and detect an N/O string including the plurality of target memory cells through this checking process.

The N/O string program module 132 may convert a plurality of pieces of target data to be programmed on the plurality of target memory cells included in the detected N/O string so that the plurality of pieces of target data have a certain value. For example, the N/O string program module 132 may convert a plurality of pieces of target data latched in the page buffer circuit 120 into the certain value by providing a data conversion signal DCS and the column address Y_ADD corresponding to the plurality of pieces of target data to the page buffer circuit 120. Alternatively, before the N/O string program module 132 converts a value of the plurality of pieces of target data, the page buffer circuit 120 may have pieces of data DATA to be programmed on the memory cell array 110, the data DATA being previously latched through the data I/O circuit 160. The data DATA may be provided to the page buffer circuit 120 through data lines DL.

As the number of times a program voltage is applied to a plurality of target memory cells included in an N/O string through word lines WL increases, an increased stress may be applied to the N/O string, and as a result, the N/O string may negatively affect neighboring strings or memory cells. Accordingly, the certain value may be previously set to limit the number of times that the program voltage is applied to target memory cells. For example, the certain value may be a value for forming a threshold voltage distribution of an erase state.

The N/O string program module 132 may perform a control operation so that pieces of data including converted pieces of target data are programmed on the memory cell array 110 through the page buffer circuit 120. Through an operation of the N/O string program module 132, the number of times that the program voltage is applied to word lines WL connected to a plurality of target memory cells of an N/O string may be limited. Accordingly, stress of the N/O string may be reduced, and negative affects attributed to the N/O string may be reduced.

Further referring to FIG. 2, the memory device 100 may perform a series of program sequences PS of detecting an N/O string of the memory cell array 110 in response to the write command CMD (N/O STRING DETECTION), converting pieces of target data corresponding to the detected N/O string by using the page buffer circuit 120 (TARGET DATA CONVERSION), and programming pieces of data including the converted pieces of target data on the memory cell array 110 (PROGRAM).

Figure 3A:
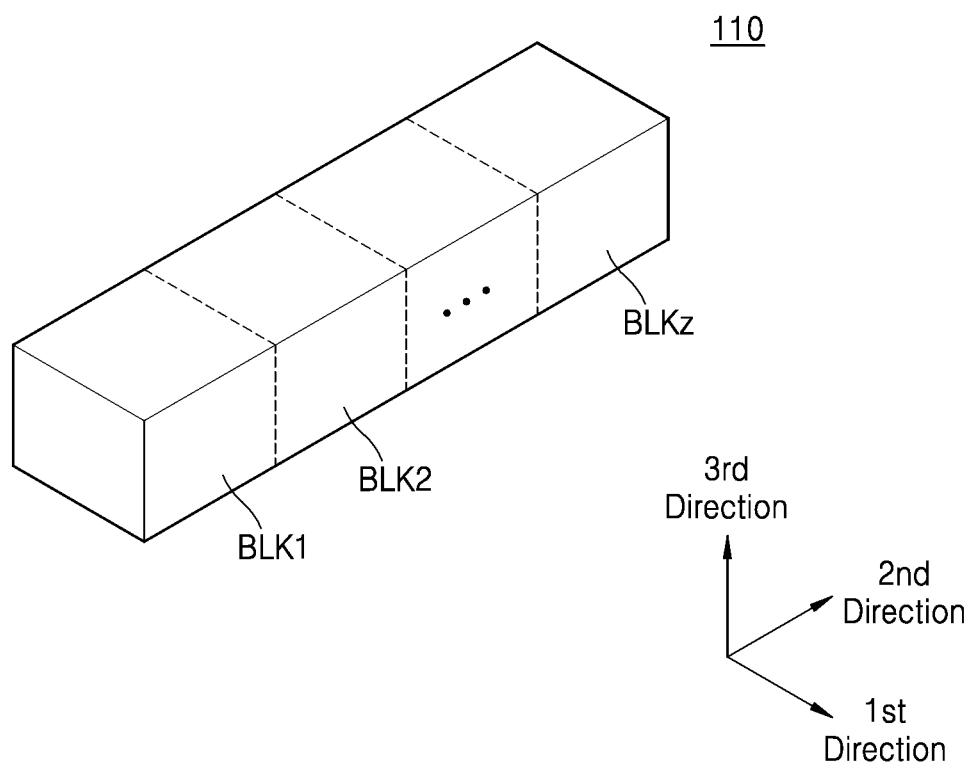
FIG. 3A is a block diagram of a memory cell array of FIG. 1.
Figure 3B:
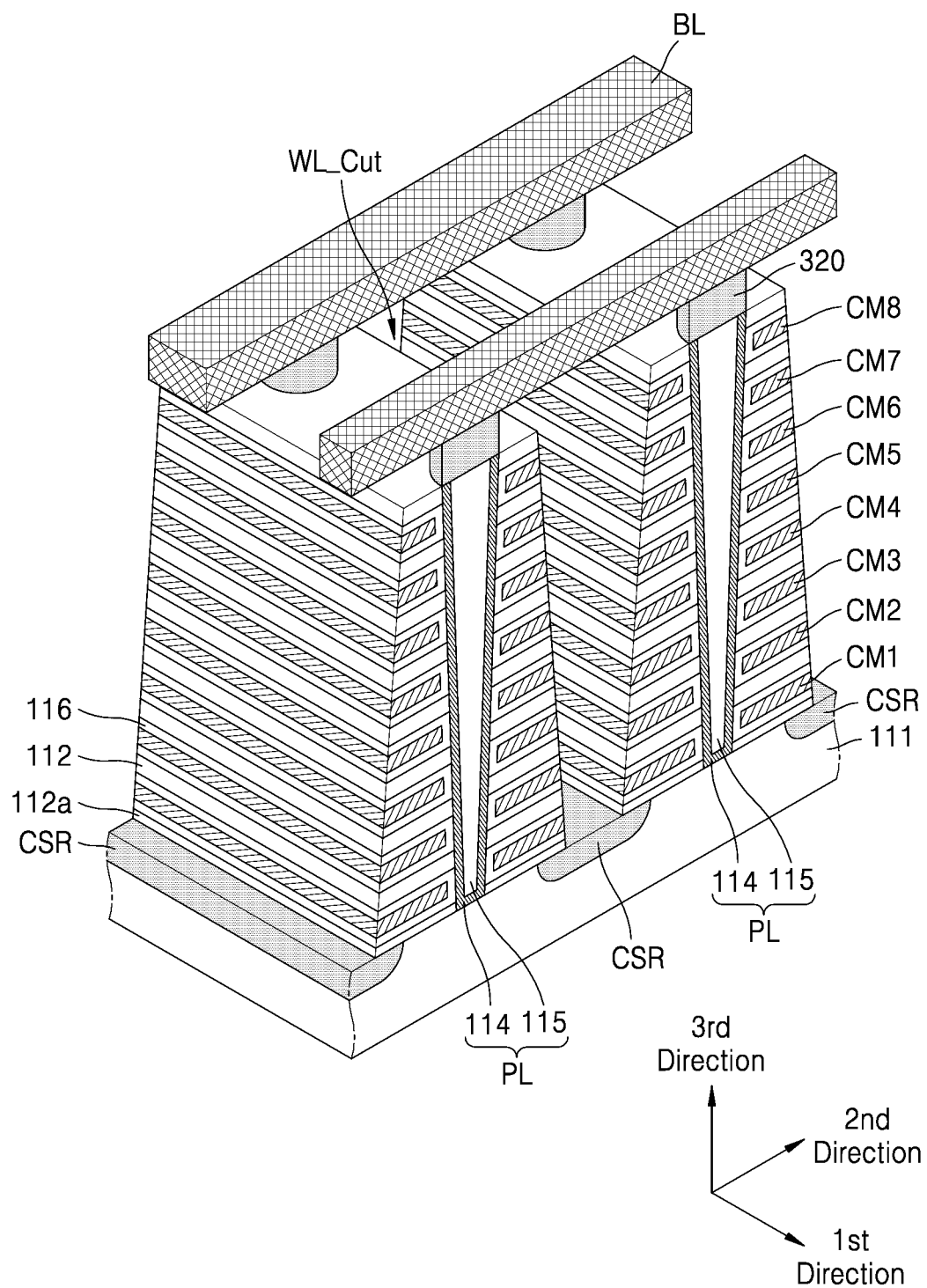
FIG. 3B is a first example of a perspective cross-sectional view of the memory cell array of FIG. 1.
Figure 3C:
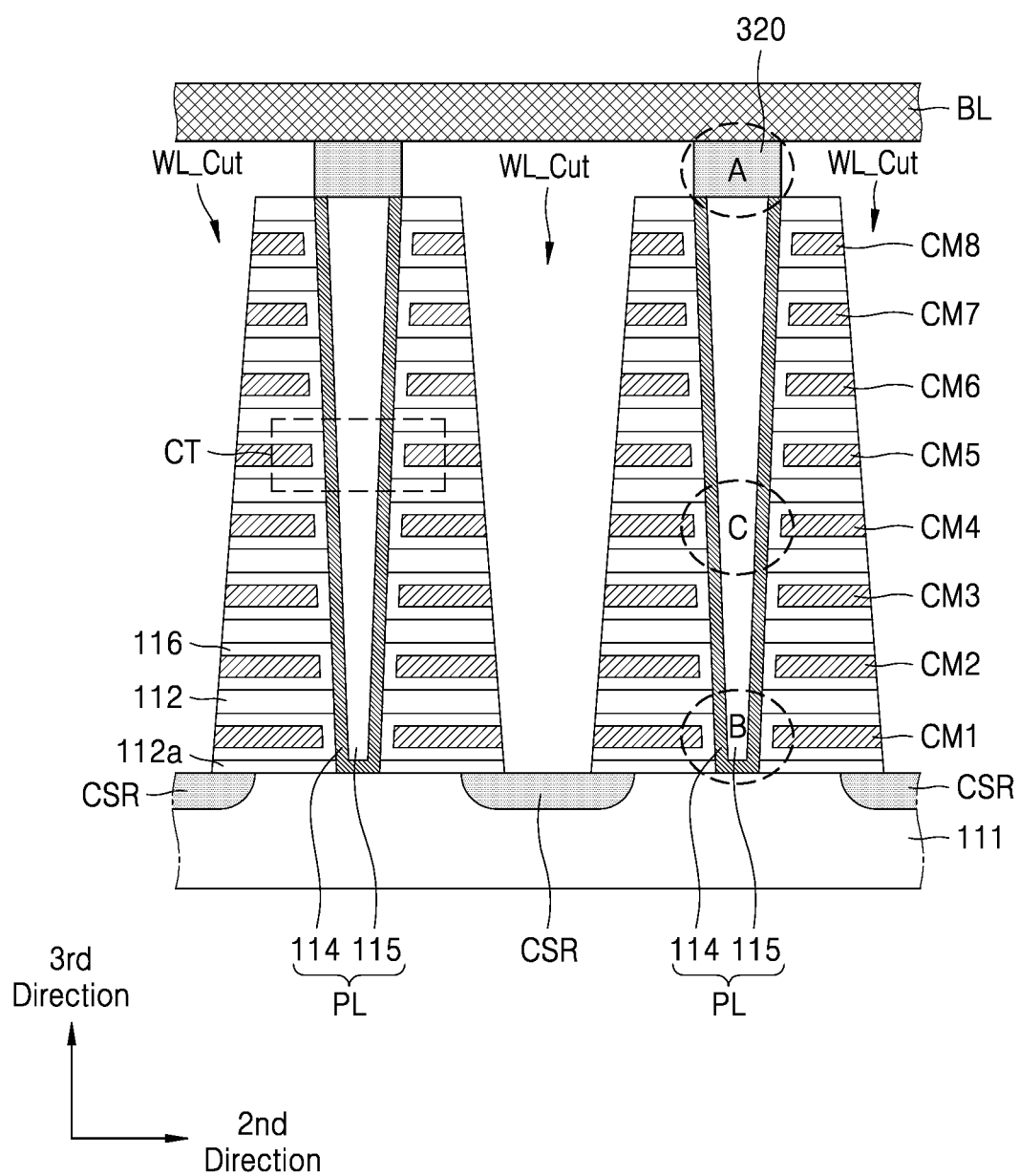
FIG. 3C is a second example of a front cross-sectional view of the memory cell array of FIG. 1.

FIG. 3A is a block diagram of the memory cell array 110 of FIG. 1, FIG. 3B is a first example of a perspective cross-sectional view of the memory cell array 110 of FIG. 1, and FIG. 3C is a second example of a front cross-sectional view of the memory cell array 110 of FIG. 1.

Referring to FIGS. 1 and 3A, the memory cell array 110 may include a plurality of memory blocks, e.g., first to zth memory blocks BLK1 to BLKz. Each of the memory blocks BLK1 to BLKz may have a 3D structure (or vertical structure). For example, each of the memory blocks BLK1 to BLKz may have structures extending in first, second and third directions. Each of the memory blocks BLK1 to BLKz may include a plurality of cell strings extending in the second direction. The plurality of cell strings may be separated from each other in the first and third directions. Cell strings of one memory block are connected to a plurality of bit lines BL, a plurality of string select lines SSL, a plurality of word lines WL, or a plurality of ground select lines GSL and a common source line. Cell strings of the plurality of memory blocks BLK1 to BLKz may share the plurality of bit lines BL. For example, the plurality of bit lines BL may extend in the second direction to be shared by the plurality of memory blocks BLK1 to BLKz.

The memory blocks BLK1 to BLKz may be selected by the address decoder 150 shown in FIG. 1. For example, the address decoder 150 may be configured to select a memory block corresponding to a received address ADDR from among the memory blocks BLK1 to BLKz. Program, read, and erase operations may be performed on a selected memory block. In addition, according to exemplary embodiments of the inventive concept, the program sequence PS of FIG. 2 may be performed on the selected memory block. However, this is only illustrative and the inventive concept is not limited thereto. For example, the program sequence PS of FIG. 2 may be performed on a memory sub-block unit or a certain memory group unit.

Further referring to FIGS. 3B and 3C, a substrate 111 is provided. For example, the substrate 111 may include a well having a first conductive type. A plurality of common source regions CSR extending in the first direction and separated from each other in the second direction may be on the substrate 111. The plurality of common source regions CSR may be commonly connected to form a common source line. The plurality of common source regions CSR have a second conductive type, the second conductive type being different from the first conductive type of the substrate 111.

Between two adjacent common source regions CSR among the plurality of common source regions CSR, a plurality of insulating materials 112 and 112a may be sequentially disposed on the substrate 111 in the third direction (e.g., a direction orthogonal to the substrate 111). The plurality of insulating materials 112 and 112a may be separated from each other in the third direction. The plurality of insulating materials 112 and 112a may extend in the first direction.

Between the two adjacent common source regions CSR, a plurality of pillars PL sequentially arranged in the first direction and passing through the plurality of insulating materials 112 and 112*a* in the second direction may be provided. For example, the plurality of pillars PL may come in contact with the substrate 111 by passing through the plurality of insulating materials 112 and 112*a*. For example, between the two adjacent common source regions CSR, the plurality of pillars PL may be separated from each other in the first direction. The plurality of pillars PL may be arranged in a line in the first direction.

For example, the plurality of pillars PL may include a plurality of materials. For example, the plurality of pillars PL may include channel films 114 and internal materials 115. The channel films 114 may include a semiconductor material (e.g., silicon) having the first conductive type. The channel films 114 may include a semiconductor material (e.g., silicon) having the same conductive type as that of the substrate 111. The channel films 114 may include an intrinsic semiconductor having no conductive type.

The internal materials 115 may include an insulating material. For example, the internal materials 115 may include an insulating material such as silicon oxide. For example, the internal materials 115 may include an air gap. Between the two adjacent common source regions CSR, information storage layers 116 may be provided at exposed surfaces of the plurality of insulating materials 112 and 112*a* and the plurality of pillars PL. The information storage layers 116 may store information by capturing or discharging charges.

Between the two adjacent common source regions CSR and between the plurality of insulating materials 112 and 112*a*, conductive materials CM1, CM2, CM3, CM4, CM5, CM6, CM7 and CM8 are provided at exposed surfaces of the information storage layers 116. The conductive materials CM1 to CM8 may extend in the first direction. On the plurality of common source regions CSR, the conductive materials CM1 to CM8 may be partitioned by word line cuts WL_Cut. The word line cuts WL_Cut may expose the plurality of common source regions CSR therethrough. The word line cuts WL_Cut may extend in the first direction. For example, the conductive materials CM1 to CM8 may include a metallic conductive material. The conductive materials CM1 to CM8 may include a non-metallic conductive material.

For example, the information storage layer 116 provided at the top surface of an insulating material located at the top among the plurality of insulating materials 112 and 112*a* may be removed. For example, the information storage layers 116 provided at side surfaces facing the plurality of pillars PL among side surfaces of the plurality of insulating materials 112 and 112*a* may be removed.

A plurality of drains 320 may be provided on the plurality of pillars PL. For example, the plurality of drains 320 may include a semiconductor material (e.g., silicon) having the second conductive type. For example, the plurality of drains 320 may include a semiconductor material (e.g., silicon) having an N conductive type.

Bit lines BL extending in the second direction and separated from each other in the first direction may be provided on the plurality of drains 320. The bit lines BL are connected to the plurality of drains 320. For example, the plurality of drains 320 and the bit lines BL may be connected through contact plugs. For example, the bit lines BL may include metallic conductive materials. For example, the bit lines BL may include non-metallic conductive materials such as polysilicon. The conductive materials CM1 to CM8 may have first to eighth heights in an order from the substrate 111. For example, the eighth height of the conductive material CM8 is greater than the first height of the conductive material CM1.

The plurality of pillars PL may form a plurality of strings together with the information storage layers 116 and the conductive materials CM1 to CM8. Each of the plurality of pillars PL form one string together with the information storage layers 116 and adjacent conductive materials CM1 to CM8. On the substrate 111, the plurality of pillars PL may be provided in a row direction and a column direction. The conductive materials CM8 may form rows. Pillars PL connected to the same conductive materials CM8 may form one row. The bit lines BL may form columns. Pillars PL connected to the same bit line BL may form one column. The plurality of pillars PL form a plurality of strings arranged in the row and column directions together with the information storage layers 116 and the conductive materials CM1 to CM8. Each string may include a plurality of cell transistors (or memory cells) stacked in a direction orthogonal to the substrate 111.

Referring to part A of FIG. 3C, a defect may occur at a pad part between the drains 320 and the bit lines BL in a manufacturing process, and as a result, a string may not be electrically connected to a bit line BL.

Referring to part B of FIG. 3C, holes in which pillars PL are to be formed may not come in contact with the substrate 111 due to a defect in a manufacturing process. In other words, holes in which pillars PL are to be formed may not be formed deep enough, and in this case, channel films 114 may not come in contact with the substrate 111. Particularly, in a process of forming a pillar PL, the pillar PL may not be connected to a ground select transistor due to an etching failure.

Referring to part C of FIG. 3C, faults may occur due to an error in etching or deposition when a channel of a memory cell is formed.

Due to faults at the parts A to C of FIG. 3C, a string may have no channel and correspond to an N/O string, and memory cells included in the N/O string may be always read to be in an off state in a read operation regardless of programmed data.

According to exemplary embodiments of the inventive concept, to minimize negatively affects of an N/O string in a program operation, an N/O string may be detected, target memory cells included in the detected N/O string may be converted, and then the program operation may be performed.

Figure 4:
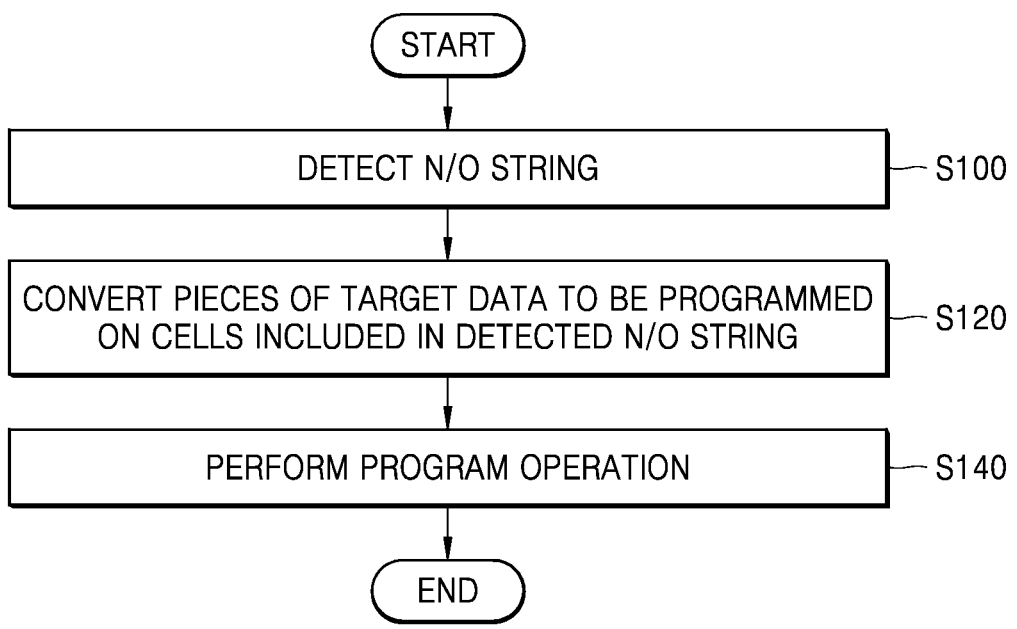
FIG. 4 is a flowchart of an operating method of a memory device, according, to an exemplary embodiment of the inventive concept.

FIG. 4 is a flowchart of an operating method of a memory device, according to an exemplary embodiment of the inventive concept.

Referring to FIG. 4, in operation S100, the memory device may detect an N/O string from a plurality of strings of a target memory block to be programmed, in response to a write command. In operation S120, the memory device may convert target data to be programmed on cells included in the detected N/O string so that the pieces of target data have a certain value. In operation S140, the memory device may perform an operation of programming pieces of data including the converted pieces of target data on a memory cell array. Although FIG. 4 has been described with the number of N/O strings being one, the inventive concept is not limited thereto, and the number of N/O strings may be plural. For example, in operation S140, the programming may be performed on the plurality of N/O strings. In addition, a program operation of a memory device according to exemplary embodiments of the inventive concept may be performed on a memory sub-block unit or a certain memory group unit.

Figure 5:
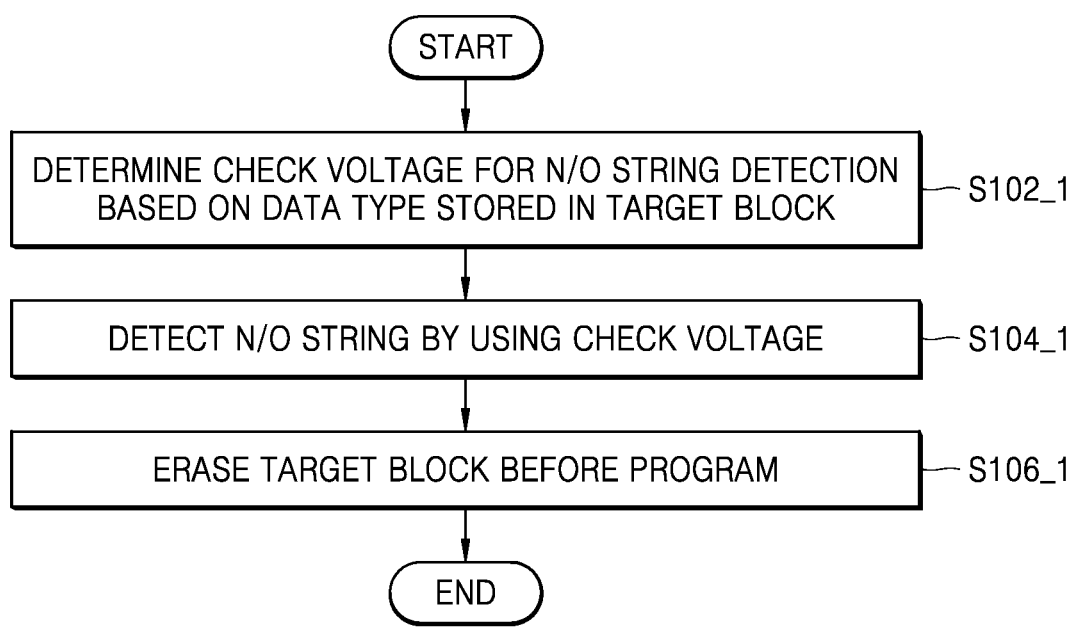
FIG. 5 is a flowchart of an example of operation S100 of FIG. 4 in detail.

FIG. 5 is a flowchart of operation S100 of FIG. 4 in detail.

Referring to FIG. 5, in operation S102_1, the memory device may determine a check voltage for N/O string detection based on a memory cell type of a target memory block to be programmed. As described above, the memory cell type is associated with the number of bits of data to be stored in a memory cell, and for example, the memory cell type of the target memory block may be any one of a single-level cell, a multi-level cell, a triple-level cell and a quad-level cell. According to an exemplary embodiment of the inventive concept, the check voltage may be determined to have a higher level than the reference voltage for verifying a top-level program state of a memory cell.

In operation S104_1, the memory device may detect an N/O string included in the target memory block by using the check voltage. Particularly, the memory, device may sequentially apply the check voltage to a plurality of word lines connected to the target memory block and detect an N/O string based on a result signal indicating an ON/OFF state of each memory cell through bit lines connected to the target memory block. In operation S106_1, the memory device may erase the target memory block before programming on the target memory block is performed.

FIGS. 6A to 6F are views for describing an operating method of a memory device, according to an exemplary embodiment of the inventive concept.

Figure 6A:
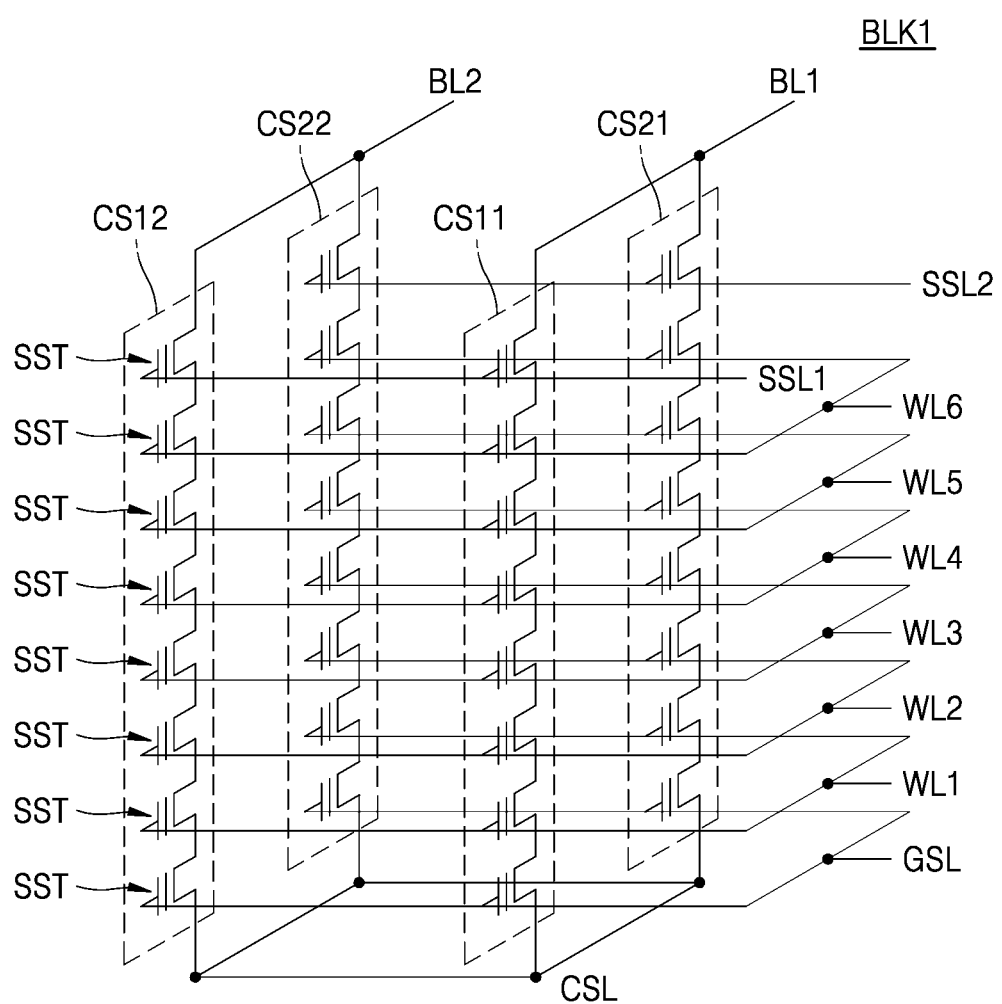
FIGS. 6A. 6B, 6C, 6D, 6E and 6F are views for describing an operating method of a memory device, according to an exemplary embodiment of the inventive concept.

FIG. 6A shows an equivalent circuit of the first memory block BLK1 of FIG. 3A, and referring to FIG. 6A, strings CS11, CS12, CS21, and CS22 may be between first and second bit lines BL1 and BL2 and a common source line CSL. The strings CS11 and CS21 may be connected between the first bit line BL1 and the common source line CSL. The strings CS12 and CS22 may be connected between the second bit line BL2 and the common source line CSL. The common source regions CSR (see FIG. 3B) may be commonly connected to form the common source line CSL.

Memory cells having the same height may be commonly connected to one word line, and when a voltage is applied to a word line of a particular height, the voltage may be applied to all the strings CS11, CS12, CS21, and CS22. Strings in different rows may be connected to different string select lines, e.g., first and second string select lines SSL1 and SSL2, respectively. The strings CS11, CS12, CS21, and CS22 may be selected or not be selected in a row unit by selecting or not selecting the first and second string select lines SSL1 and SSL2. For example, the strings CS11 and CS12 or CS21 and CS22 connected to an unselected string select line SSL1 or SSL2 may be electrically disconnected from the first and second bit lines BL1 and BL2. The strings CS21 and CS22 or CS11 and CS12 connected to a selected string select line SSL2 or SSL1 may be electrically connected to the first and second bit lines BL1 and BL2.

The strings CS11, CS12, CS21, and CS22 may be connected to the first and second bit lines BL1 and BL2 in a column unit. The strings CS11 and CS21 may be connected to the first bit line BL1, and the strings CS12 and CS22 may be connected to the second bit line BL2. The strings CS11, CS12, CS21, and CS22 may be selected or not be selected in a column unit by selecting or not selecting the first and second bit lines BL1 and BL2. Hereinafter, a program operation according to an exemplary embodiment of the inventive concept is described based on a structure of the first memory block BLK1 shown in FIG. 6A, but this is merely an example, and thus, the inventive concept may also be applied to the first memory block BLK1 having a different structure.

Referring to FIG. 6B, in step DT_STEP of detecting an N/O string among the strings CS11, CS12, CS21, and CS22, the memory device may apply a first bit line voltage VBL1 to the first and second bit lines BL1 and BL2, apply a first string select voltage (or a turn-on voltage) VSSL1 to a selected string select line of the first and second string select lines SSL1 and SSL2, apply a second string select voltage (or a turn-off voltage) VSSL2 to an unselected string select line of the first and second string select lines SSL1 and SSL2, sequentially apply a first check voltage VCK1 to word lines WL1, WL2, WL3, WL4, WL5 and WL6, apply a first ground select line voltage VGSL1 to a ground select line GSL, apply a first common source line voltage VCSL1 to the common source line CSL, and apply a ground voltage VSS to a substrate.

For example, the first bit line voltage VBL1 may be a power source voltage VCC, the first string select voltage VSSL1 may be the power source voltage VCC, and the second string select voltage VSSL2 may be the ground voltage VSS or a low voltage having a similar level thereto. The first check voltage VCK1 may have a higher level than a level of a certain reference voltage as described above. A detailed description of the first check voltage VCK1 may be made with reference to FIGS. 6C to 6E.

Figure 6C:
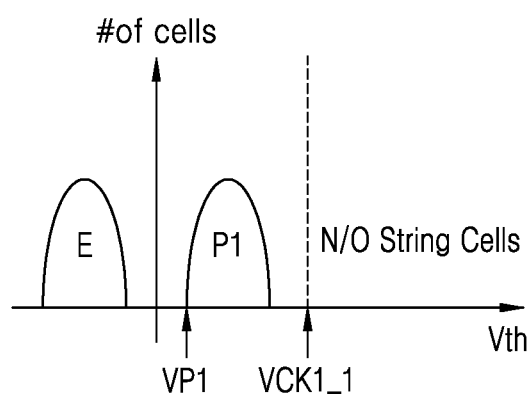
Figure 6D:
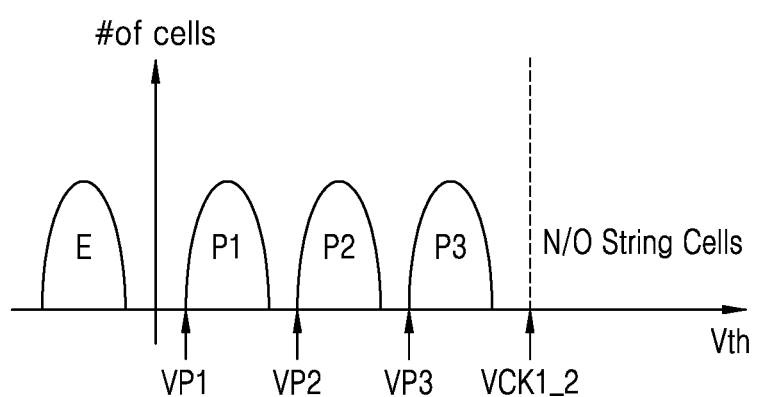
Figure 6E:
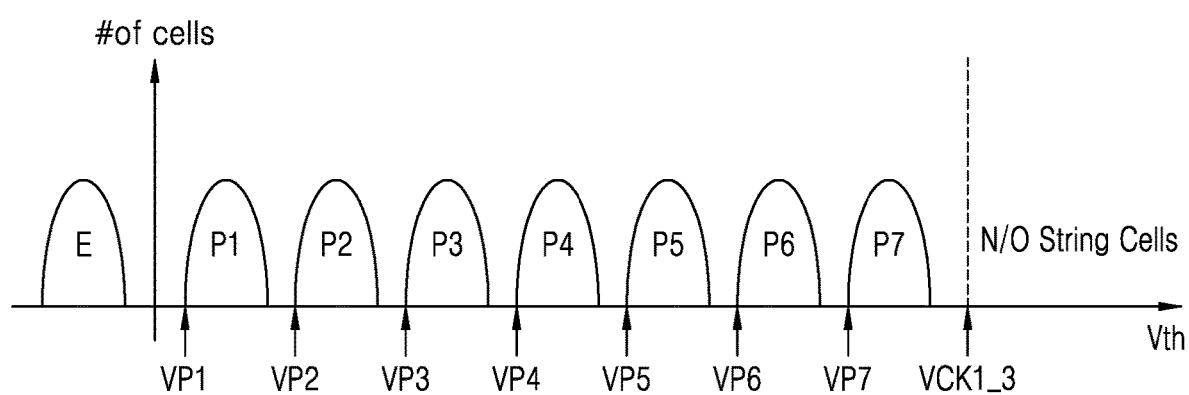

Referring to FIG. 6C, when a memory cell type is a single-level cell, normal memory cells may correspond to any one of an erase state E and a first program state P1, and target memory cells (N/O string cells) included in an N/O string have no channel formed therein and thus may appear to have a higher threshold voltage than a threshold voltage of a memory cell in a top-level program state (e.g., the first program state P1) regardless of an actual threshold voltage. Accordingly, a first check voltage VCK1_1 may have a higher level than a reference voltage VP1 for verifying the top-level program state P1. In FIGS. 6C-6E, Vth refers to threshold voltage.

Further referring to FIG. 6D, when a memory cell type is a multi-level cell, normal memory cells may correspond to any one of the erase state E and first, second and third program states P1, P2 and P3, and target memory cells (N/O string cells) included in an N/O string have no channel formed therein and thus may appear to have a higher threshold voltage than a threshold voltage of a memory cell in a top-level program state (e.g., the third program state P3) regardless of an actual threshold voltage. Accordingly, a first check voltage VCK1_2 may have a higher level than a reference voltage VP3 for verifying the top-level program state P3.

Referring to FIG. 6E, when a memory cell type is a triple-level cell, normal memory cells may correspond to any one of the erase state E and first, second, third, fourth, fifth, sixth and seventh program states P1, P2, P3, P4, P5, P6 and P7, and target memory cells (N/O string cells) included in an N/O string have no channel thrilled therein and thus may appear to have a higher threshold voltage than a threshold voltage of a memory cell in a top-level program state (e.g., the seventh program state P7) regardless of an actual threshold voltage. Accordingly, a first check voltage VCK1_3 may have a higher level than a reference voltage VP7 for verifying the top-level program state P7.

Figure 6F:
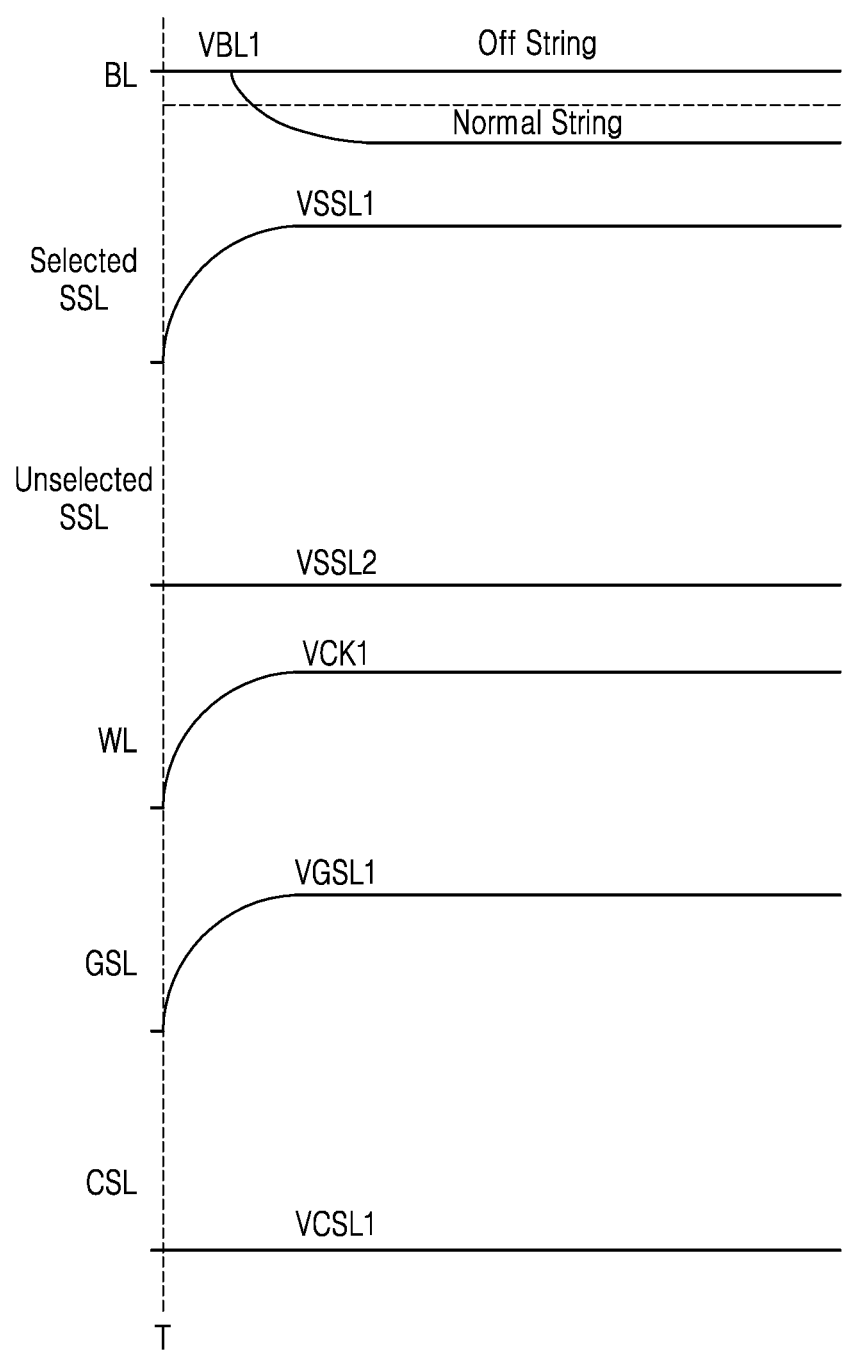

Further referring to FIG. 6F, the voltages described in FIG. 6B may be applied to a bit line BL, a selected string select line Selected SSL, an unselected string select line Unselected SSL, a selected word line WL, the ground select line GSL, and the common source line CSL in a first time point T that is a start point of the detection step DT_STEP. For example, a voltage of a bit line BL connected to a normal string may drop to be lower than the first bit line voltage VBL1 by a certain amount, and a voltage of a bit line BL connected to an N/O string may maintain the first bit line voltage VBL1. In this case, the memory device may detect an N/O string.

Figure 7:
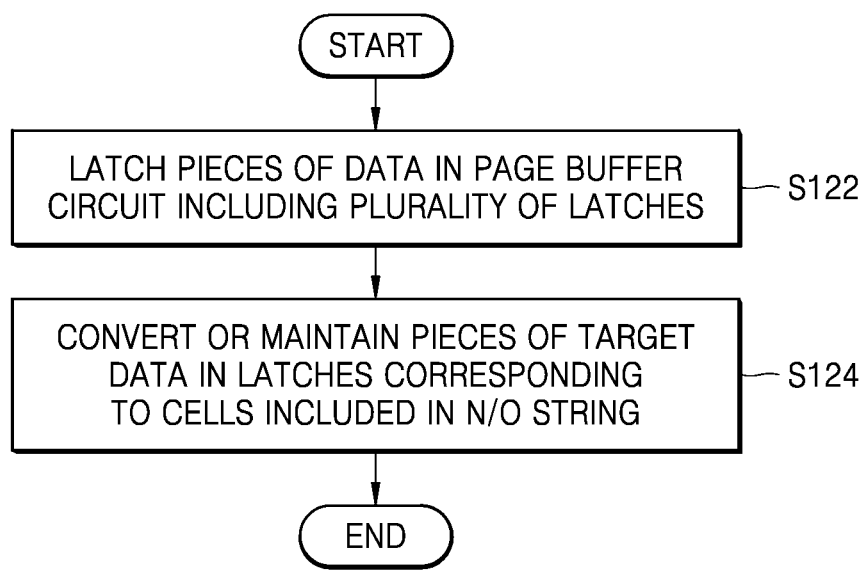
FIG. 7 is a flowchart of operation S120 of FIG. 4 in detail.

FIG. 7 is a flowchart of operation S120 of FIG. 4 in detail.

Referring to FIG. 7, in operation S122, the memory device may latch pieces of data to be programmed on a memory cell array to a page buffer circuit including a plurality of latch units. The pieces of data may be encoded pieces of data received from a memory controller, and for example, the memory controller may encode pieces of data received from a host, by using an error correcting codeword, and provide the encoded pieces of data to the memory device. In operation S124, the memory device may convert or maintain target data latched in latch units corresponding to target memory cells included in an N/O string so that each of the pieces of target data has a certain value. As described above, the certain value may be preset as a value matched with inhibit data for forming a threshold voltage distribution of an erase state.

Figure 8A:
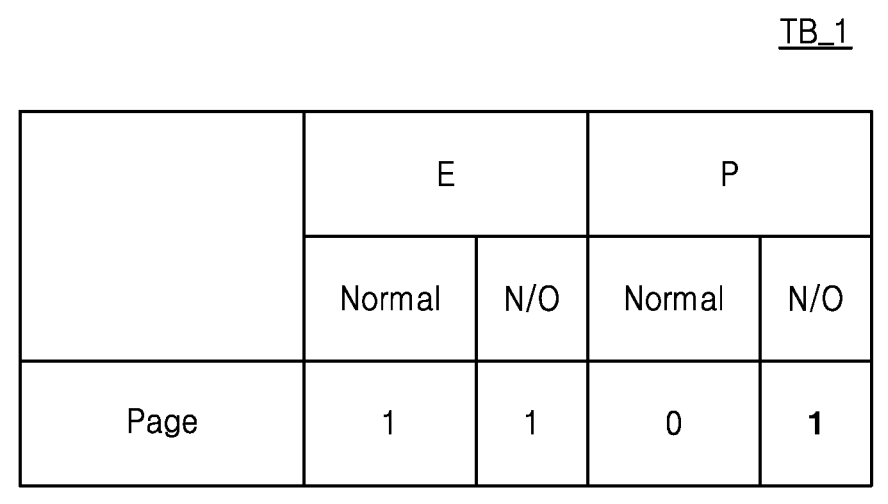

FIGS. 8A to 8C are tables for describing a conversion operation on pieces of target data corresponding to an N/O string of a memory device, according to an exemplary embodiment of the inventive concept. Hereinafter, a page may correspond to a page buffer included in a page buffer circuit connected to a memory cell array of the memory device.

Referring to a first table TB_1 of FIG. 8A, when a memory cell type is a single-level cell, the memory device may program data '1' on a normal memory cell Normal so that the normal memory cell Normal has a threshold voltage of the erase state E, and program data '0' on the normal memory cell Normal so that the normal memory cell Normal has a threshold voltage of the first program state P1. The memory device may convert target data '0' to be programmed on a target memory cell N/O included in an N/O string into target data '1' on a page of the target memory cell N/O.

Referring to a second table TB_2 of FIG. 8B, when a memory cell type is a multi-level cell, the memory device may program data '1' on a first page of a normal memory cell Normal and program data '1' on a second page thereof so that the normal memory cell Normal has a threshold voltage of the erase state E, and program data '0' on a first page of a normal memory cell Normal and program data '1' on a second page thereof so that the normal memory cell Normal has a threshold voltage of the first program state P1. In addition, the memory device may program data '0' on a first page of a normal memory cell Normal and program data '0' on a second page thereof so that the normal memory cell Normal has a threshold voltage of the second program state P2, and program data '1' on a first page of a normal memory cell Normal and program data '0' on a second page thereof so that the normal memory cell Normal has a threshold voltage of the third program state P3. Thus, the first page of the normal memory cell Normal has data '0', '0' and '1' in the first to third program states P1 to P3, respectively, and the second page of the normal memory cell Normal has data '1', '0' and '0' in the first to third program states P1 to P3, respectively The memory device may convert all target data to be programmed on a target memory cell N/O included in an N/O string into data '1' on first and second pages of the target memory cell N/O.

Referring to a third table TB_3 of FIG. 8C, when a memory cell type is a triple-level cell, the memory device may program data '1' on a first page of a normal memory cell Normal, program data '1' on a second page thereof, and program data '1' on a third page thereof so that the normal memory cell Normal has a threshold voltage of the erase state E, and program data '0' on a first page of a normal memory cell Normal, program data '1' on a second page thereof, and program data '1' on the third page thereof so that the normal memory cell Normal has a threshold voltage of the first program state P1. The memory device may program data '0' on a first page of the normal memory cell Normal, program data '0' on a second page thereof, and program data '1' on a third page thereof so that the normal memory cell Normal has a threshold voltage of the second program state P2, and program data '0' on a first page of a normal memory cell Normal, program data '0' on a second page thereof, and program data '0' on a third page thereof so that the normal memory cell Normal has a threshold voltage of the third program state P3. The memory device may program data '0' on a first page of the normal memory cell Normal, program data '1' on a second page thereof, and program data '0' on a third page thereof so that the normal memory cell Normal has a threshold voltage of the fourth program state P4, and program data '1' on a first page of a normal memory cell Normal, program data '1' on a second page page thereof, and program data '0' on a third page thereof so that the normal memory cell Normal has a threshold voltage of the fifth program state P5. The memory device may program data '1' on a first page of the normal memory cell Normal, program data '0' on a second page thereof, and program data '0' on a third page thereof so that the normal memory cell Normal has a threshold voltage of the sixth program state P6, and program data '1' on a first page of a normal memory cell Normal, program data '0' on a second page thereof, and program data '1' on a third page thereof so that the normal memory cell Normal has a threshold voltage of the seventh program state P7.

The memory device may convert all target data to be programmed on a target memory cell N/O included in an N/O string into data '1' on first to third pages of the target memory cell N/O.

As described above, the memory device may convert target data to be programmed on a target memory cell N/O into data (e.g., inhibit data) by which a normal memory cell Normal has a threshold voltage of the erase state E, and then program the inhibit data on the target memory cell N/O, thereby minimizing program stress on the target memory cell N/O.

Figure 9:
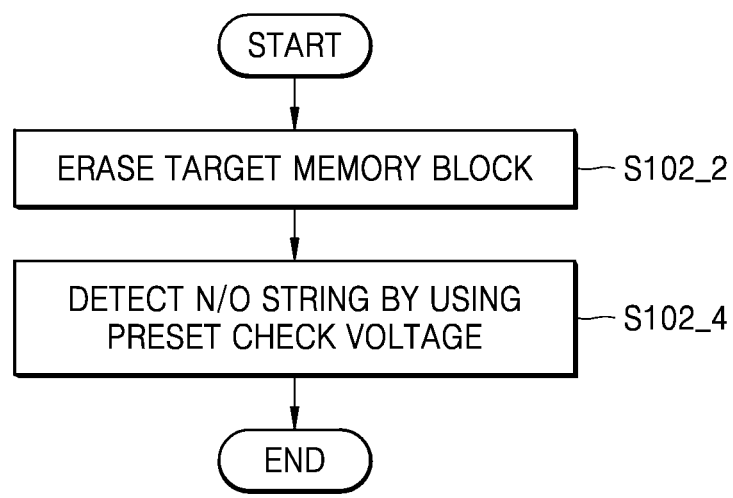
FIG. 9 is a flowchart of another example of operation S100 of FIG. 4.

FIG. 9 is a flowchart of another example of operation S100 of FIG. 4.

Referring to FIG. 9, in operation S102_2, the memory device may erase a target memory block to be programmed, in a block unit or a sub-block unit. In operation S102_4, the memory device may detect an N/O string included in the target memory block by using a preset check voltage. For example, the preset check voltage may have a higher level than a level of a voltage for verifying an erase state and may be constant regardless of cell types of memory cells of the target memory block.

Figure 10B:
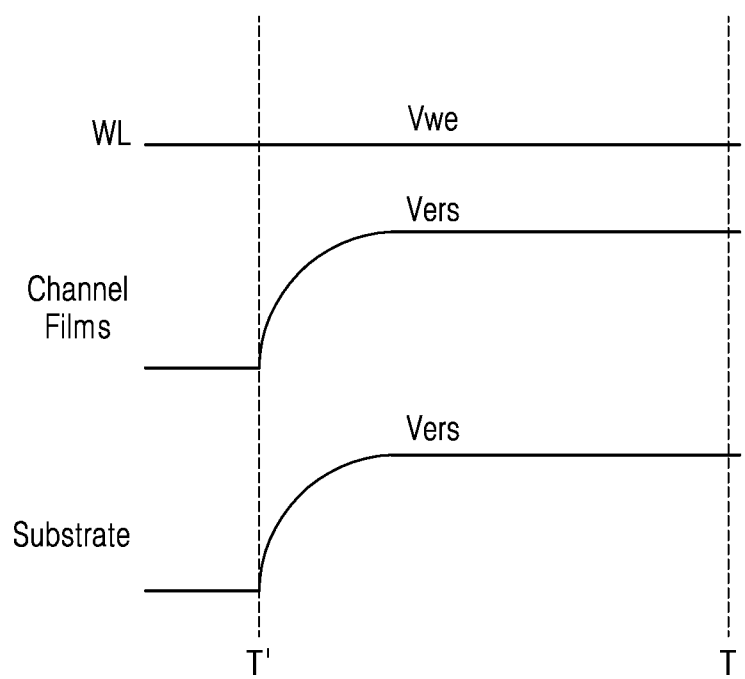

FIGS. 10A and 10B are views for describing an operating method of a memory device, on which the embodiment described with reference to FIG. 9 is reflected. Hereinafter, for convenience of understanding, a description is made with reference to the structure of the first memory block BLK1 of FIG. 6A.

Referring to FIG. 10A, the memory device may perform first step DT_STEP_1 of erasing a target memory block to be programmed, before second step DT_STEP_2 of detecting an N/O string. According to an exemplary embodiment of the inventive concept, the memory device may float the first and second bit lines BL1 and BL2 and the common source line CSL in the first step DT_STEP_1 and float the first and second string select lines SSL1 and SSL2 or supply a third string select line voltage VSSL3 to the first and second string select lines SSL1 and SSL2 in the first step DT_STEP_1. The memory device may supply a word line erase voltage Vwe to the word lines WL1 to WL6. The word line erase voltage Vwe may be the ground voltage VSS or a low voltage (including a positive voltage and a negative voltage) having a similar level thereto. In addition, the memory device may float the ground select line GSL or supply a second ground select line voltage VGSL2 to the ground select line GSL in the first step DT_STEP_1, and supply an erase voltage Vers to a substrate (111 of FIG. 3C) in the first step DT_STEP_1. The erase voltage Vers may be a high voltage. The third string select line voltage VSSL3 and the second ground select line voltage VGSL2 may be voltages having a level between the erase voltage Vers and the ground voltage VSS.

Further referring to FIG. 10B, channel films (114 of FIG. 3C) may be charged to a level of the erase voltage Vers by the erase voltage Vets supplied to the substrate (111 of FIG. 3C) at a first time T'. Due to a voltage difference between the word line erase voltage Vwe supplied to the word lines WL1 to WL6 and the erase voltage Vers of the channel films (114 of FIG. 3C), charges captured by memory cells MC1 to MC6 may be discharged, thereby performing an erase. An erase operation may be performed up to a second time T, and thereafter, the second step DT_STEP_2 may be performed.

Referring back to FIG. 10A, in the second step DT_STEP_2, a second check voltage VCK2 may be supplied to the word lines WL1 to WL6, and the second check voltage VCK2 may have the same level regardless of cell types of the memory cells. The second check voltage VCK2 may have a higher level than a verification voltage level for verifying an erase state (or a bottom-level program state (P1 of FIGS. 6C and 6D)) of a memory cell. For example, the second check voltage VCK2 may have a higher level than a level of the first verification voltage VP1 of FIGS. 6C and 6D. The rest of the voltages applied in the second step DT_STEP_2 may correspond to those of step DT_STEP described with reference to FIG. 6B.

Figure 11:
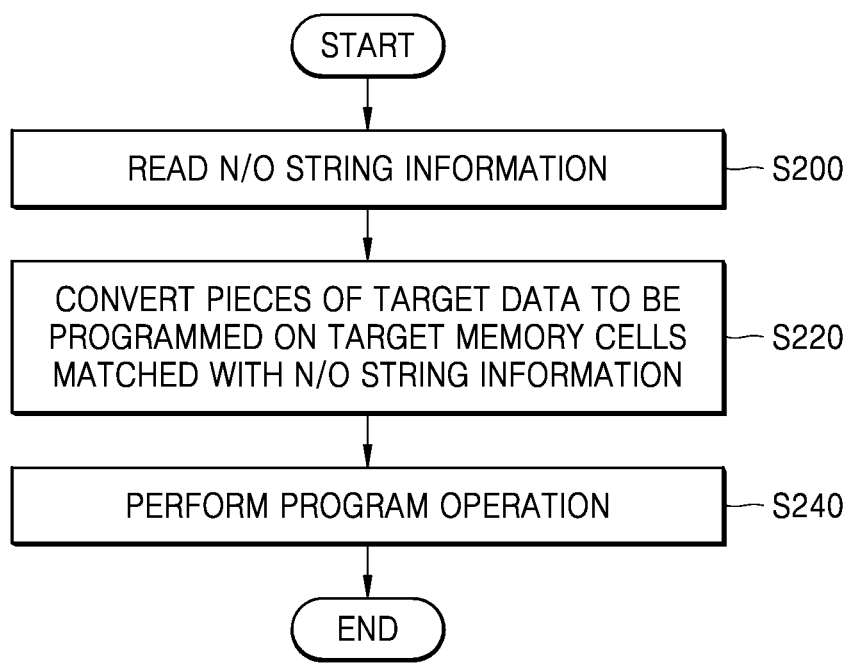
FIG. 11 is a flowchart of an operating method of a memory device, according to an exemplary embodiment of the inventive concept.

FIG. 11 is a flowchart of an operating method of a memory device, according to an exemplary embodiment of the inventive concept.

Referring to FIG. 11, in operation S200, the memory device may read N/O string information. The N/O string information may include address information of N/O strings included in each of a plurality of memory blocks. The memory device may generate the N/O string information by having previously performed an N/O string detection operation on the plurality of memory blocks or based on a result of a previously performed N/O string detection operation. The memory device may store the N/O string information in spare memory cells included in a memory cell array. In operation S220, the memory device may convert pieces of target data to be programmed on target memory cells matched with the N/O string information into inhibit data. As described above, the memory device may perform a conversion operation by using a page buffer circuit. In operation S240, the memory device may program pieces of data latched in the page buffer circuit on the memory cell array. Through the above-described operations, the inhibit data may be programmed on the target memory cells, and program stress of the target memory cells may be reduced.

Figure 12A:
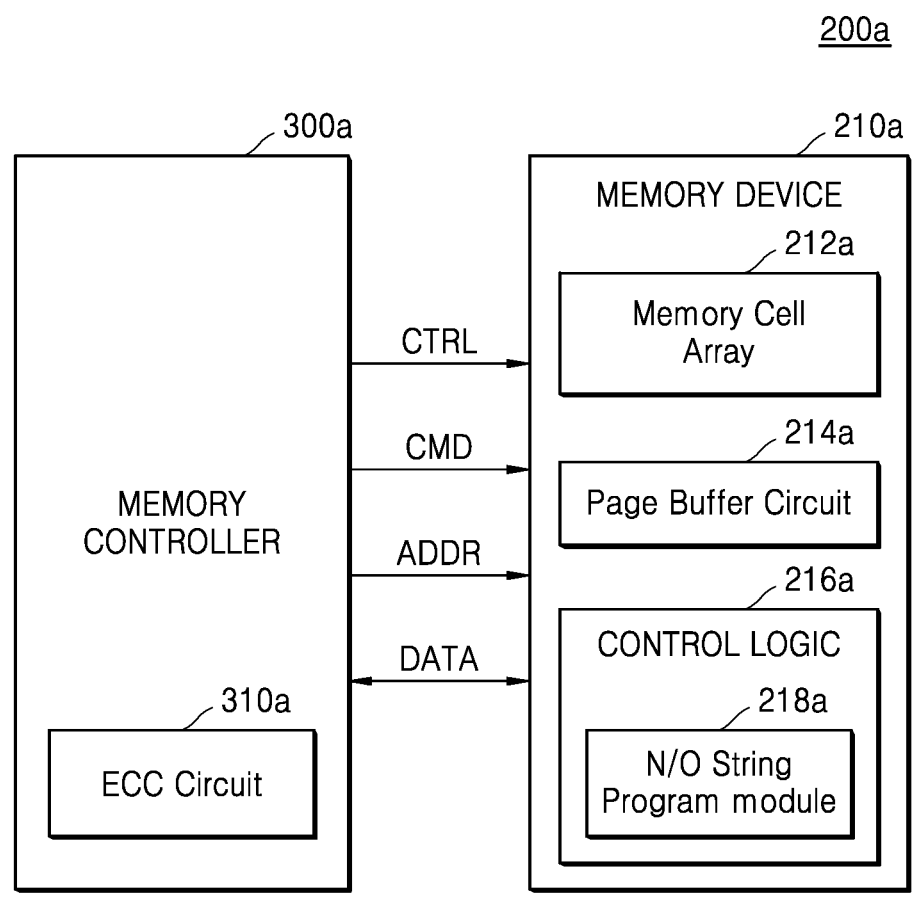
FIGS. 12A and 12B are block diagrams of memory systems according to exemplary embodiments of the inventive concept.
Figure 12B:
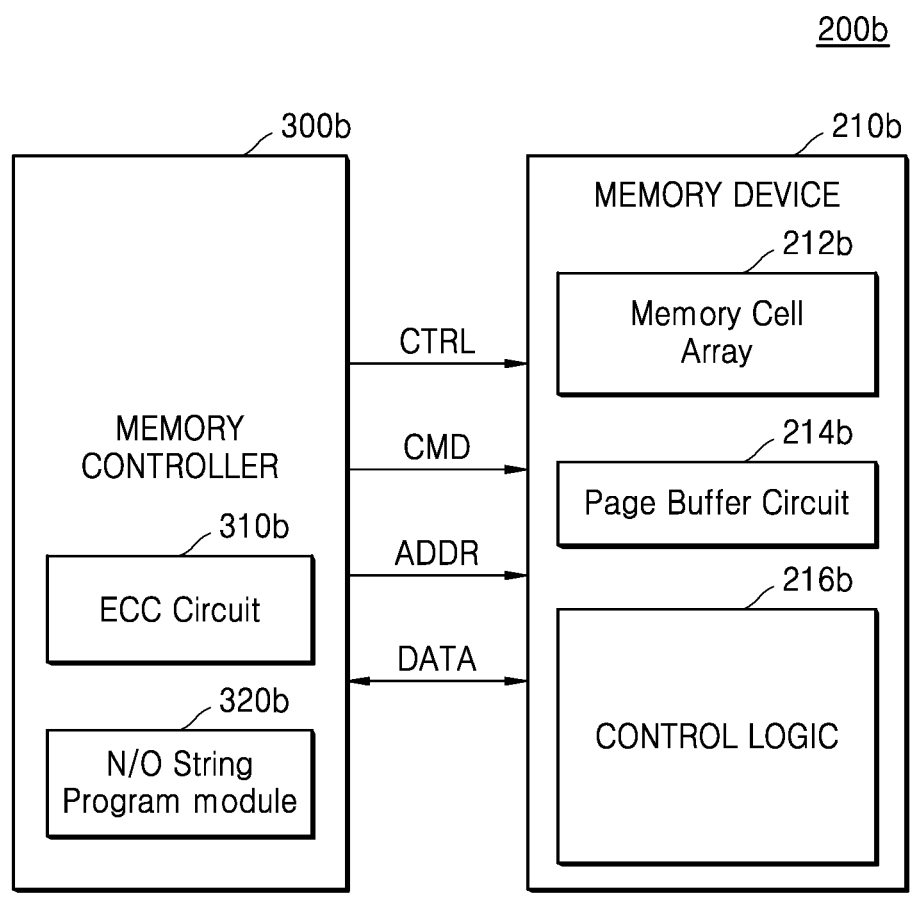

FIGS. 12A and 12B are block diagrams of memory systems 200a and 200b according to exemplary embodiments of the inventive concept.

Referring to FIG. 12A, the memory system 200a may include a memory device 210a and a memory controller 300a. The memory controller 300a may control the memory device 210a to read pieces of data stored in the memory device 210a or write data on the memory device 210a, in response to a read/write request from a host. Particularly, the memory controller 300a may control program (or write), read, and erase operations of the memory device 210a by providing a command CMD, an address ADDR and a control signal CTRL to the memory device 210a. In addition, data DATA to be written and read data DATA may be transmitted and received between the memory controller 300a and the memory device 210a.

In addition, the memory controller 300a may communicate with an external host through various standard interfaces. For example, the memory controller 300a includes a host interface, and the host interface provides various standard interfaces between the host and the memory controller 300a. The standard interfaces may include various interface schemes such as advanced technology attachment (ATA), serial ATA (SATA), external SATA (e-SATA), small computer small interface (SCSI), serial attached SCSI (SAS), peripheral component interconnection (PCI), PCI express (PCI-E), institute of Electrical and Electronics Engineers (IEEE) 1394, universal serial bus (USB), a secure digital (SD) card interface, a multi-media card (MMC) interface, an embedded multi-media card (eMMC) interface, a universal flash storage (UFS) interface, and a compact flash (CF) card interface.

According to an exemplary embodiment of the inventive concept, the memory device 210a may include a memory cell array 212a, a page buffer circuit 214a, and a control logic 216a, and the control logic 216a may include an N/O string program module 218a. As described above, the N/O string program module 218a may detect an N/O string from a target memory block or a target memory sub-block in response to the program command CMD and the address ADDR received from the memory controller 300a and perform a data conversion operation using the page buffer circuit 214a based on the detection result. In other words, the N/O string program module 218a may convert pieces of target data latched in the page buffer circuit 214a into inhibit data and program the inhibit data on target memory cells included in an N/O string.

The memory controller 300a may include an error correcting code (ECC) circuit 310a, The ECC circuit 310a may perform an error correction operation on pieces of data DATA read from the memory device 210a. For example, the ECC circuit 310a may provide error-corrected data to the host by performing an error correction operation on pieces of data DATA including pieces of target data convened by the N/O string program module 218a. This way, the memory system 200a may ensure high data reliability.

Referring to FIG. 12B, compared with FIG. 12A, an N/O string program module 320b may be included in a memory controller 300b. In other words, the memory controller 300b may perform an operation of detecting an N/O string in a memory cell array 212b of memory device 210b and an operation of convening pieces of target data to be programmed on target memory cells of the N/O string. The memory device 210b may further include page buffer circuit 214b and control logic 216b. A particular embodiment of the operations performed by the systems of FIGS. 12A and 12B will be described below with reference to FIGS. 13B and 13C.

Figure 13A:
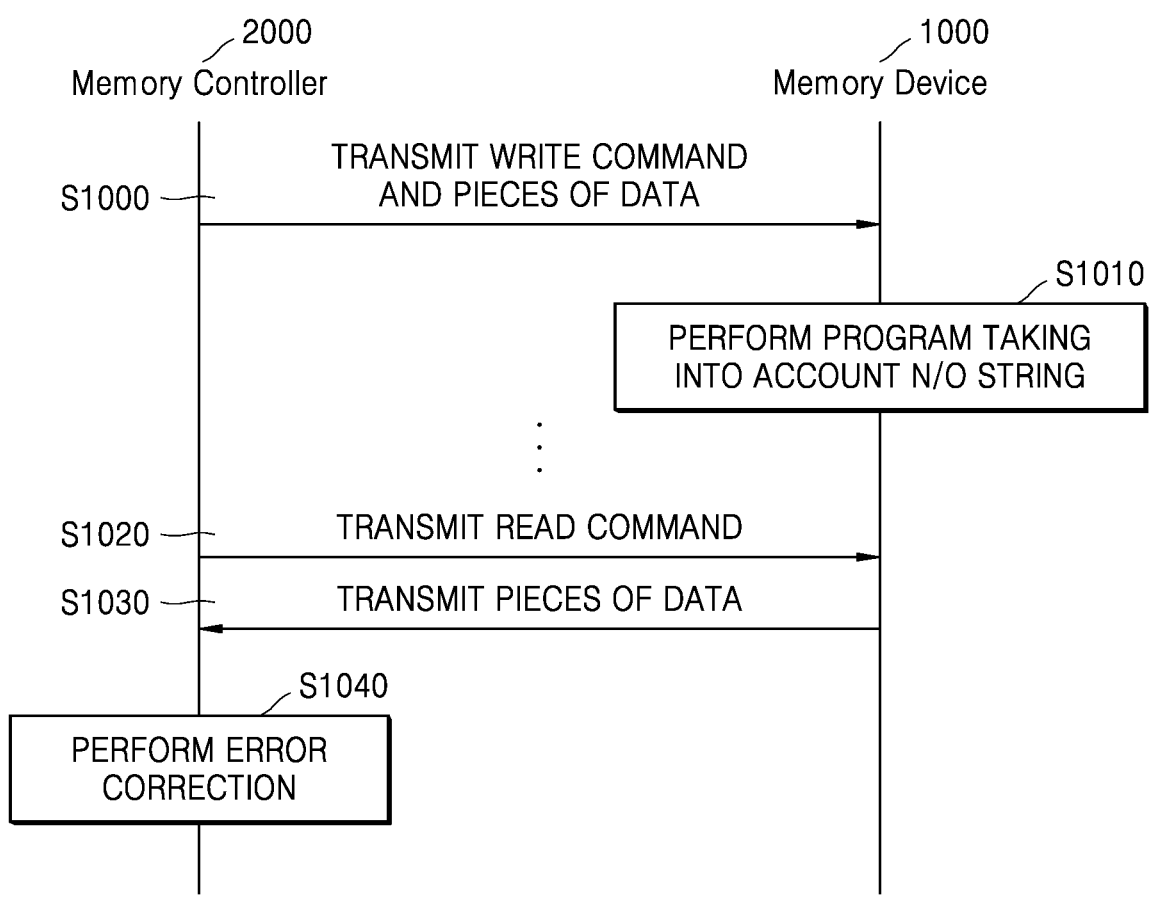
FIGS. 13A, 13B and 13C are signaling diagrams for describing operating methods of a memory system, according to exemplary embodiments of the inventive concept.
Figure 13B:
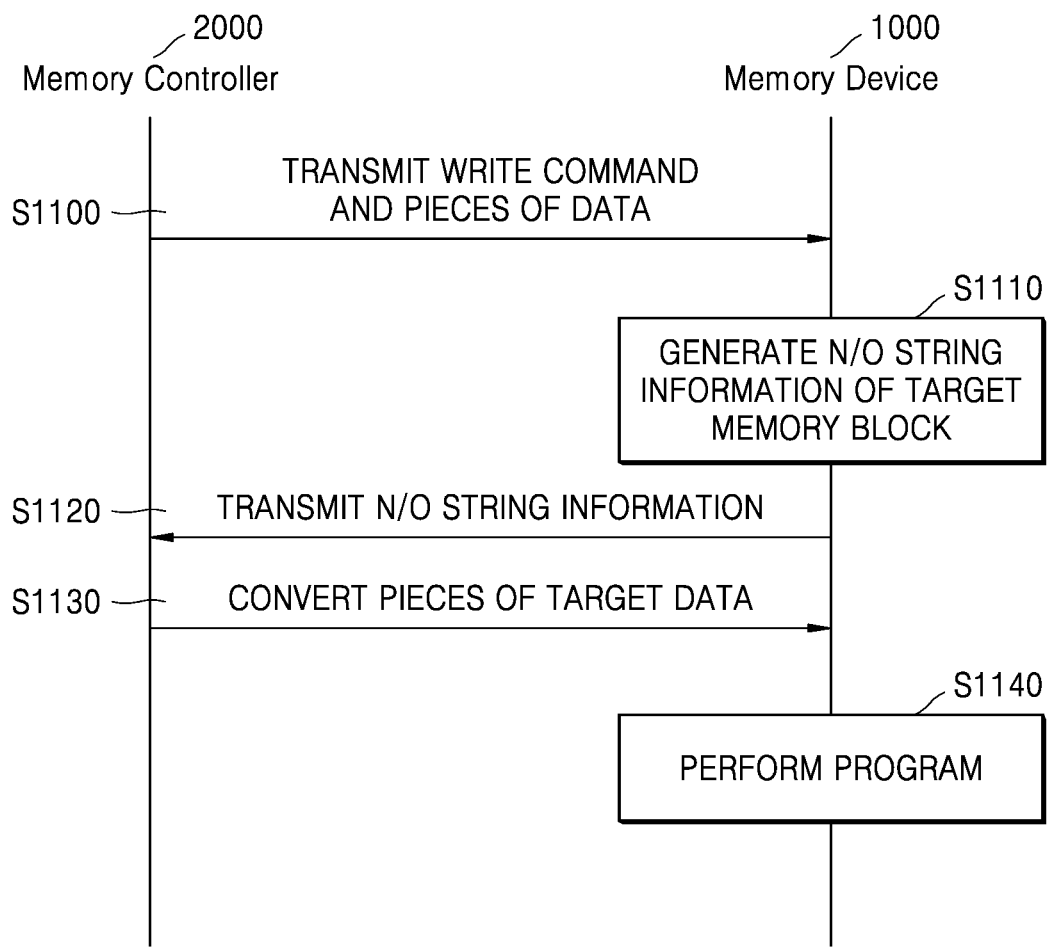
Figure 13C:
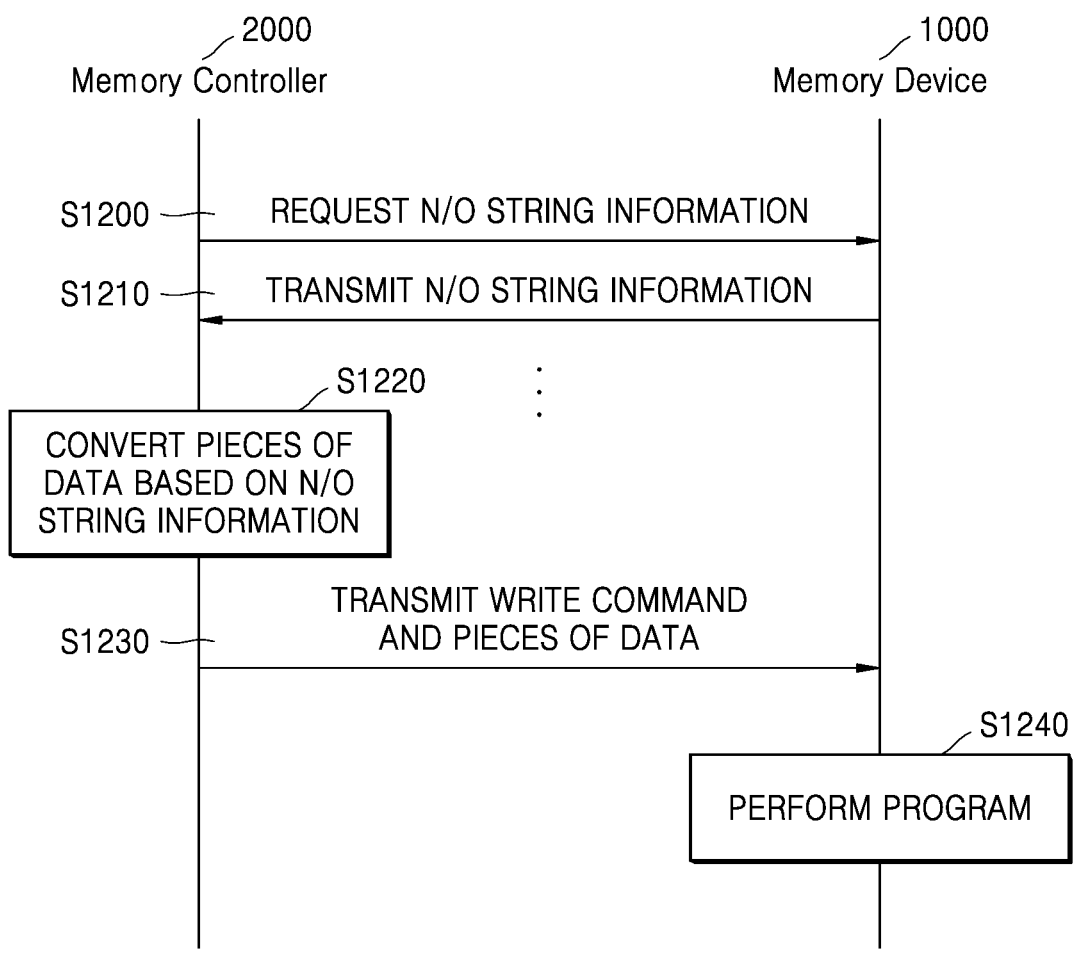

FIGS. 13A to 13C are signaling diagrams for describing operating methods of a memory system, according to exemplary embodiments of the inventive concept. FIG. 13A shows an operating method of a memory system when the embodiment of FIG. 12A is applied, and FIGS. 13B and 13C show an operating method of a memory system when the embodiment of FIG. 12B is applied Referring to FIG. 13A in operation S1000, a memory controller 2000 may transmit a write command and pieces of data to a memory device 1000. In operation S1010, a memory device 1000 may perform a program taking into account an N/O string. As described above, the memory device 1000 may detect an N/O string of a target memory block (or a target memory sub-block) in response to a write command, convert pieces of target data of target memory cells in the N/O string into inhibit data by using a page buffer circuit based on the detection result, and then program the inhibit data on the target memory cells. A particular description of operation S1010 has been made above and is thus omitted hereinafter. Thereafter, in operation S1020, the memory controller 2000 may transmit a read command to the memory device 1000. In operation S1030, the memory device 1000 may transmit pieces of data programmed on a target memory block to the memory controller 2000 in response to the read command. In operation S1040, the memory controller 2000 may perform error correction on the received pieces of data.

Referring to FIG. 13B, in operation S1100, the memory controller 2000 may transmit a write command and pieces of data to the memory device 1000. In operation S1110, the memory device 1000 may generate N/O string information of a target memory block in response to the write command. In operation S1120, the memory device 1000 may transmit the N/O string information to the memory controller 2000. In operation S1130, the memory controller 2000 may control conversion of pieces of target data to be programmed on target memory cells of an N/O string, based on the N/O string information. Particularly, the memory controller 2000 may control conversion of pieces of target data latched in a page buffer circuit into inhibit data. In operation S1140, the memory device 1000 may program pieces of data latched in a page buffer circuit on a memory cell array. According to an exemplary embodiment of the inventive concept, the memory controller 2000 may receive the N/O string information from the memory device 1000 through a separate signal pin or signal line. According to some embodiments of the inventive concept, the memory controller 2000 may provide an additional command to the memory device 1000 so that the memory device 1000 generates the N/O string information. The additional command may be provided to the memory device 1000 through a separate signal pin or signal line, and the signal pin or signal line through which the N/O string information is transmitted may be used.

Referring to FIG. 13C, in operation S1200, the memory controller 2000 may request N/O string information from the memory device 1000. In operation S1210, the memory device 1000 may transmit the N/O string information to the memory controller 2000 in response to the request. As described above, the N/O string information includes address information of N/O strings included in each of a plurality of memory blocks and may be stored in the memory device 1000. A signal for requesting the N/O string information and the N/O string information may be provided to the memory device 1000 and the memory controller 2000, respectively. In operation S1220, the memory controller 2000 may convert pieces of target data to be programmed on target memory cells of an N/O string into inhibit data based on the N/O string information. In operation S1230, the memory controller 2000 may transmit a write command and pieces of data including the inhibit data to the memory device 1000. In operation S1240, the memory device 1000 may program the received pieces of data on a memory cell array in response to the write command.

FIGS. 13A to 13C are merely exemplary and thus the inventive concept is not limited thereto. For example, various operations matched with program sequences according to exemplary embodiments of the inventive concept may be performed.

Figure 14:
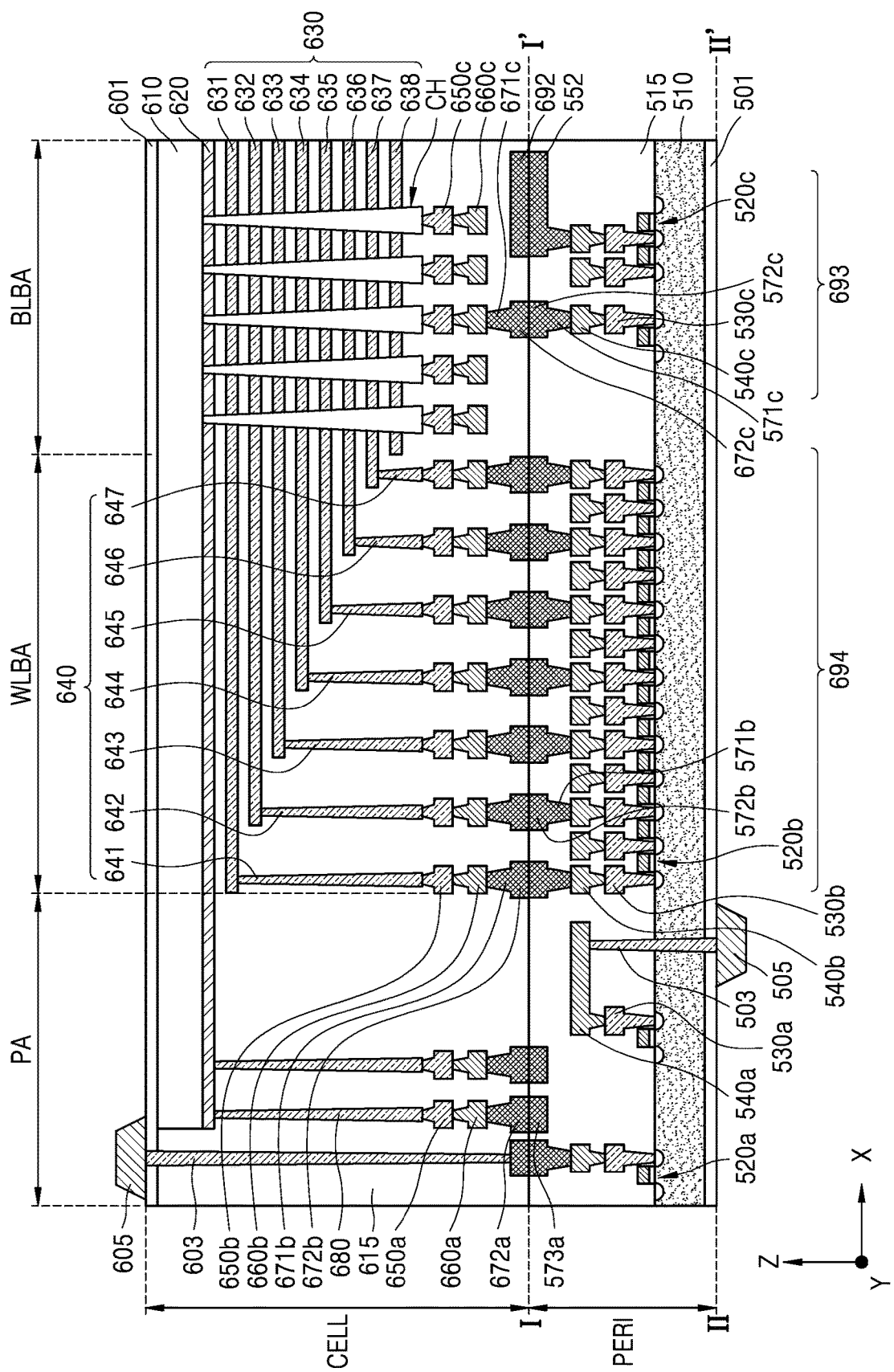
FIG. 14 is a view of a chip to chip (C2C) structure applied to a memory device, according to an exemplary embodiment of the inventive concept.

FIG. 14 is a view of a chip to chip (C2C) structure applied to a memory device 400, according to an exemplary embodiment of the inventive concept.

Referring to FIG. 14, the memory device 400 may have a C2C structure. The C2C structure may indicate that an upper chip including a cell area CELL is produced on a first wafer, a lower chip including a peripheral circuit area PERI is produced on a second wafer that is different from the first wafer, and then, the upper chip is connected to the lower chip by a bonding scheme. For example, the bonding scheme may indicate that a bonding metal formed on the top metal layer of the upper chip is electrically connected to a bonding metal formed on the top metal layer of the lower chip. For example, when the bonding metal is formed of copper (Cu), the bonding scheme may be a Cu—Cu bonding scheme, and the bonding metal may also be formed of aluminum or tungsten.

Each of the peripheral circuit area PERI and the cell area CELL of the memory device 400 may include an external pad banding area PA, a word line bonding area WLBA, and a bit line bonding area BLBA.

The peripheral circuit area PERI may include a first substrate 510, an interlayer insulating layer 515, a plurality of circuit elements 520a, 520b, and 520c on the first substrate 510, first metal layers 530a, 530b, and 530c respectively connected to the plurality of circuit elements 520a, 520b, and 520c, and second metal layers 540a, 540b, and 540c on the first metal layers 530a, 530b, and 530c. According to an exemplary embodiment of the inventive concept, the first metal layers 530a, 530b, and 530c may be formed of tungsten having a relatively high resistance, and the second metal layers 540a, 540b, and 540c may be formed of Cu having a relatively low resistance.

Although only the first metal layers 530a, 530b, and 530c and the second metal layers 540a, 540b, and 540c are shown and described, the inventive concept is not limited thereto. For example, at least one metal layer may be further formed on the second metal layers 540a, 540b, and 540c. At least some of the at least one metal layer formed on the second metal layers 540a, 540b, and 540c may be formed of aluminum having a lower resistance than Cu forming the second metal layers 540a, 540b, and 540c.

The interlayer insulating layer 515 is on the first substrate 510 to cover the plurality of circuit elements 520a, 520b, and 520c, the first metal layers 530a, 530b, and 530c, and the second metal layers 540a, 540b, and 540c and may include an insulating material such as silicon oxide or silicon nitride.

Lower banding metals 571b and 572b may be formed on the second metal layer 540b of the word line bonding area WLBA. In the word line bonding area WLBA, the lower bonding metals 571b and 572b in the peripheral circuit area PERI may be electrically connected to upper bonding metals 671b and 672b in the cell area CELL, and the lower bonding metals 571b and 572b and the upper bonding metals 671b and 672b may be formed of aluminum, Cu, or tungsten.

The cell area CELL may provide at least one memory block. The cell area CELL may include a second substrate 610 and a common source line 620. A plurality of word lines 630 (631, 632, 633, 634, 635, 636, 637 and 638) may be stacked on the second substrate 610 in a direction (Z-axis direction) orthogonal to an upper surface of the second substrate 610. String select lines and ground select lines may be arranged at upper parts and lower parts of the plurality of word lines 630, respectively, and the plurality of word lines 630 may be arranged between the string select lines and the ground select lines.

In the bit line bonding, area BLBA, a channel structure CH may extend in the direction orthogonal to the upper surface of the second substrate 610 and pass through the plurality of word lines 630, the string select lines, and the ground select lines. The channel structure CH may include a data storage layer, a channel layer, a buried insulating layer, and the like, and the channel layer may be electrically connected to a first metal layer 650c and a second metal layer 660c. For example, the first metal layer 650c may be a bit line contact, and the second metal layer 660c may be a bit line and hereinafter may be referred to as such. According to an exemplary embodiment of the inventive concept, the second metal layer (or the bit line) 660c may extend in the first direction (Y-axis direction) parallel to the upper surface of the second substrate 610.

In FIG. 14, an area in which the channel structure CH, the bit line 660c, and the like are arranged may be referred to as the bit line bonding area BLBA. In the bit line bonding area BLBA, the bit line 660c may be electrically connected to circuit elements 520c configured to provide a page buffer 693 in the peripheral circuit area PERI. For example, the bit line 660c may be connected to an upper bonding metal 671c and 672c in the peripheral circuit area PERI, and the upper bonding metal 671c and 672c may be connected to a lower bonding metal 571c and 572c connected to the circuit elements 520c of the page buffer 693.

In the word line bonding area WLBA, the plurality of word lines 630 may extend in the second direction (X-axis direction) parallel to the upper surface of the second substrate 610 and may be connected to a plurality of cell contact plugs 640 (641, 642, 643, 644, 645, 646 and 647). The plurality of word lines 630 and the plurality of cell contact plugs 640 may be connected to each other on pads provided by extending at least some of the plurality of word lines 630 by different lengths in the second direction. A first metal layer 650b and a second metal layer 660b may be sequentially connected to upper parts of the plurality of cell contact plugs 640 connected to the plurality of word lines 630. In the word line bonding area WLBA, the plurality of cell contact plugs 640 may be connected to the peripheral circuit area PERI through the upper bonding metal 671b and 672b in the cell area CELL and the lower bonding metal 571b and 572b in the peripheral circuit area PERI.

The plurality of cell contact plugs 640 may be electrically connected to circuit elements 520b configured to provide a row decoder 694 in the peripheral circuit area PERI. According to an exemplary embodiment of the inventive concept, an operating voltage of the circuit elements 520b configured to provide the row decoder 694 may differ from an operating voltage of the circuit elements 520c configured to provide the page buffer 693. For example, the operating, voltage of the circuit elements 520c configured to provide the page buffer 693 may be higher than the operating voltage of the circuit elements 520b configured to provide the row decoder 694.

In the external pad bonding area PA, a common source line contact plug 680 may be arranged. The common source line contact plug 680 may be formed of a conductive material such as a metal, a metal compound, or polysilicon and may be electrically connected to the common source line 620. A first metal layer 650a and a second metal layer 660a may be sequentially stacked on the common source line contact plug 680. For example, an area in which the common source line contact plug 680, the first metal layer 650a, and the second metal layer 660a are arranged may be referred to as the external pad bonding area PA.

In the external pad bonding area PA, first and second I/O pads 505 and 605 may be arranged. A lower insulating layer 501 covering a lower surface of the first substrate 510 may be formed below the first substrate 510, and the first I/O pad 505 may be on the lower insulating layer 501. The first I/O pad 505 may be connected to at least one of the plurality of circuit elements 520a, 520b, and 520c in the peripheral circuit area PERI through a first I/O contact plug 503 and may be isolated from the first substrate 510 by the lower insulating layer 501. In addition, a side insulating layer may be arranged between the first I/O contact plug 503 and the first substrate 510 to electrically isolate the first I/O contact plug 503 from the first substrate 510, An upper insulating layer 601 covering the upper surface of the second substrate 610 may be formed on the second substrate 610, and the second I/O pad 605 may be on the upper insulating layer 601. The second I/O pad 605 may be connected to at least one of the plurality of circuit elements 520a, 520b, and 520c in the peripheral circuit area PERI through a second I/O contact plug 603.

According to exemplary embodiments of the inventive concept, in an area in which the second I/O contact plug 603 is arranged, the second substrate 610 and the common source line 620 may not be arranged. In addition, the second I/O pad 605 may not overlap the plurality of word lines 630 in the third direction (Z-axis direction). The second I/O contact plug 603 may be isolated from the second substrate 610 in a direction parallel to the upper surface of the second substrate 610 and connected to the second I/O pad 605 by passing through an interlayer insulating layer 615 in the cell area CELL.

According to exemplary embodiments of the inventive concept the first I/O pad 505 and the second I/O pad 605 may be selectively formed. For example, the memory device 400 may include only the first I/O pad 505 on the first substrate 501 or include only the second I/O pad 605 on the second substrate 610. Alternatively, the memory device 400 may include both the first I/O pad 505 and the second I/O pad 605.

In each of the external pad bonding area PA and the bit line bonding area BLBA included in each of the cell area CELL and the peripheral circuit area PERI, a metal pattern of a top metal layer is as a dummy pattern, or the top metal layer may be vacant.

In the external pad bonding area PA, the memory device 400 may have a lower metal pattern 573a formed in the same shape as an upper metal pattern 672a in the cell area CELL on the top metal layer in the peripheral circuit area PERI in correspondence to the upper metal pattern 672a on the top metal layer in the cell area CELL. The lower metal pattern 573a on the top metal layer in the peripheral circuit area PERI may not be connected to a separate contact in the peripheral circuit area PERI. Likewise, in the external pad bonding area PA, an upper metal pattern formed in the same shape as a lower metal pattern in the peripheral circuit area PERI may be formed on an upper metal layer in the cell area CELL in correspondence to a lower metal pattern on the top metal layer in the peripheral circuit area PERI.

The lower bonding metal 571b and 572b may be formed on the second metal layer 540b in the word line bonding area WLBA. In the word line bonding area WLBA, the lower bonding metal 571b and 572b in the peripheral circuit area PERI may be electrically connected to the upper bonding metal 671b and 672b in the cell area CELL by a bonding scheme.

In addition, in the bit line bonding area BLBA, an upper metal pattern 692 in the same shape as a lower metal pattern 552 in the peripheral circuit area PERI may be formed on the top metal layer in the cell area CELL in correspondence to the lower metal pattern 552 on the top metal layer in the peripheral circuit area PERI. No contact may be formed on the upper metal pattern 692 on the top metal layer in the cell area CELL.

Exemplary embodiments of the inventive concept provide a memory device for performing a program operation of a certain sequence in order for memory cells of a not-open string not to negatively affect neighboring memory cells and a system including the same.

While the inventive concept has been particularly shown and described with reference to exemplary embodiments thereof, it will be understood that various changes in form and details may be made thereto without departing from the spirit and scope of the inventive concept as set forth in the following claims.

What is claimed is:

1. A method of operating a memory device, wherein the memory device comprises:
   a memory cell array comprising a plurality of memory cells forming a plurality of strings in a vertical direction with a substrate; and
   a control logic,
   wherein the method comprises: detecting a not-open string (N/O string) from the plurality of strings in response to a write command and converting target data to be programmed on a target memory cell in the N/O string so that the target data have a value that limits a number of times a program voltage is applied to the target memory cell,
   the memory device further comprising a page buffer circuit configured to latch the target data,
   wherein the converting the target data to have the value comprises: converting the target data latched in the page buffer circuit to have the value, and programming the converted target data on the target memory cell through the page buffer circuit,
   wherein the target data is latched by 1 bit in each of a plurality of page buffers in the page buffer circuit, and
   wherein the method further comprises converting at least one of pieces of data latched in the plurality of page buffers so that the target data has the value, and converting the pieces of data latched in the plurality of page buffers to be the same
   wherein a type of target memory cell is a multi-level cell type or more.

2. The method of claim 1, wherein the memory device further comprises a voltage generator configured to generate a plurality of voltages to be provided to the memory cell array,
   wherein the method further comprises controlling the voltage generator to apply a check voltage higher than a reference voltage to a plurality of word lines connected to the plurality of memory cells.

3. The method of claim 2, wherein the reference voltage is used to verify a top-level program state of the plurality of memory cells.

4. The method of claim 2, wherein the reference voltage is used to verify an erase state of the plurality of memory cells.

5. The method of claim 2, wherein the plurality of memory cells form one sub-block or one block, and
   the method further comprises controlling an erase operation on the plurality of memory cells before detecting the N/O string.

6. The method of claim 2, further comprising detecting the N/O string by detecting the target memory cell that was turned off by the check voltage.

7. The method of claim 1, further comprising detecting the N/O string by reading string information of the N/O string from the memory cell array.

8. The method of claim 2, wherein the check voltage has the same level for all cell types of the plurality of memory cells.

9. The method of claim 1, wherein the value matches inhibit data for forming a threshold voltage distribution of an erase state.

10. The method of claim 7, wherein the memory cell array further comprises a plurality of spare memory cells configured to store the string information.

11. An operating method of a memory device comprising a plurality of memory cells forming a plurality of strings in a vertical direction with a substrate, the operating method comprising:
    detecting a not-open string (N/O string) from the plurality of strings in response to a write command:
    converting, to have a value, target data to be programmed on a target memory cell in the N/O string; and
    performing a program operation on the target memory cell,
    wherein the converting of the target data to have the value comprises:
    latching the target data by 1 bit in a plurality of page buffers of a page buffer circuit in the memory device; and
    converting at least one of pieces of data latched in the plurality of page buffers so that the target data has the value,
    wherein the converting the at least one of the pieces of data latched in the plurality of page buffers comprises:
    converting the pieces of data latched in the plurality of page buffers to be the same,
    wherein a type of target memory cell is a multi-level cell type or more.

12. The operating method of claim 11, wherein the detecting of the N/O string comprises:
    performing a read operation by applying a check voltage to word lines connected to the plurality of memory cells;
    identifying the plurality of memory cells read as off as the target memory cell; and
    generating N/O string address information based on identification results.

13. The operating method of claim 12, further comprising erasing the plurality of memory cells before detecting the N/O string, wherein the check voltage has a higher level than a level of a voltage for verifying an erase state of the plurality of memory cells.

14. The operating method of claim 11, wherein the values limits a number of times a program voltage is applied to the target memory cell.

15. The operating method of claim 11, wherein the performing of the program operation on the target memory cell comprises programming the converted pieces of data latched in the page buffers on the target memory cell.

* * * * *